United States Patent
Nakayama et al.

(10) Patent No.: US 7,435,989 B2
(45) Date of Patent: Oct. 14, 2008

(54) SEMICONDUCTOR DEVICE WITH LAYER CONTAINING POLYSILOXANE COMPOUND

(75) Inventors: Tomonari Nakayama, Yokohama (JP);
Akane Masumoto, Yokohama (JP);
Shintetsu Go, Yokohama (JP);
Toshinobu Ohnishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/514,922

(22) Filed: Sep. 5, 2006

(65) Prior Publication Data

US 2007/0051947 A1    Mar. 8, 2007

(30) Foreign Application Priority Data

Sep. 6, 2005    (JP)    ............... 2005-258567

(51) Int. Cl.
*H01L 29/08* (2006.01)
*H01L 35/24* (2006.01)
*H01L 51/00* (2006.01)

(52) U.S. Cl. ....................................... 257/40
(58) Field of Classification Search ............ 257/40
See application file for complete search history.

(56) References Cited

U.S. PATENT DOCUMENTS

| | | | | |
|---|---|---|---|---|
| 5,266,222 | A | * 11/1993 | Willis et al. ................. | 508/206 |
| 5,324,543 | A | * 6/1994 | Ogawa et al. ............... | 427/387 |
| 5,659,181 | A | 8/1997 | Bridenbaugh et al. ....... | 257/40 |
| 6,617,609 | B2 | 9/2003 | Kelley et al. ............... | 257/40 |
| 6,963,080 | B2 | 11/2005 | Afzali-Ardakani et al. ... | 257/40 |
| 7,094,625 | B2 | 8/2006 | Miura et al. ................. | 438/99 |
| 7,140,321 | B2 | 11/2006 | Nakayama et al. .......... | 118/723 |
| 7,193,237 | B2 | 3/2007 | Aramaki et al. ............ | 257/40 |

(Continued)

FOREIGN PATENT DOCUMENTS

JP    5-55568    3/1993

(Continued)

OTHER PUBLICATIONS

T. Akiyama, et al., "Synthesis of .pai.-system-expanded compounds using Diels-Alder reactions", Proceedings of the 81st Annual Spring Meeting of the Chemical Society of Japan, 2002, II, p. 990, 2F9-14. (with translation).

(Continued)

*Primary Examiner*—Jerome Jackson
*Assistant Examiner*—Anthony Ho
(74) *Attorney, Agent, or Firm*—Fitzpatrick, Cella, Harper & Scinto

(57) ABSTRACT

Provided is a semiconductor device including: a substrate; a layer containing one or more kinds of polymer compounds on the substrate; and an organic semiconductor layer in contact with the layer containing the one or more kinds of polymer compounds, in which at least one kind of the one or more kinds of polymer compounds is a polymer compound having one or more secondary or tertiary aliphatic amino groups, wherein the one or more aliphatic amino groups of the polymer compound having the aliphatic amino groups are bound to at least one of a side chain or a branched chain, and wherein said the layer containing the one or more kinds of polymer compounds contains polysiloxane compounds. With the constitution, a semiconductor device excellent in crystallinity and orientation can be provided.

6 Claims, 1 Drawing Sheet

U.S. PATENT DOCUMENTS

| | | | |
|---|---|---|---|
| 2004/0048188 A1* | 3/2004 | Hatanake et al. | 430/270.1 |
| 2004/0197699 A1* | 10/2004 | Nakayama et al. | 430/270.1 |
| 2004/0238816 A1* | 12/2004 | Tano et al. | 257/40 |
| 2005/0001210 A1* | 1/2005 | Lee et al. | 257/40 |
| 2005/0032268 A1 | 2/2005 | Nishikawa et al. | 438/99 |
| 2005/0194588 A1* | 9/2005 | Sasaki et al. | 257/40 |
| 2005/0202348 A1 | 9/2005 | Nakayama et al. | 430/311 |
| 2006/0081880 A1 | 4/2006 | Miyazaki et al. | 257/200 |
| 2006/0113523 A1 | 6/2006 | Kubota et al. | 257/40 |
| 2006/0145141 A1 | 7/2006 | Miura et al. | 257/40 |
| 2006/0214159 A1 | 9/2006 | Nakayama et al. | 257/40 |
| 2007/0012914 A1 | 1/2007 | Miura et al. | 257/40 |
| 2007/0034861 A1* | 2/2007 | Nakamura | 257/40 |
| 2007/0085072 A1 | 4/2007 | Masumoto et al. | 257/40 |
| 2007/0096079 A1 | 5/2007 | Nakayama et al. | 257/40 |

FOREIGN PATENT DOCUMENTS

| | | |
|---|---|---|
| JP | 5-190877 | 7/1993 |
| JP | 8-264805 | 11/1996 |
| JP | 2003-304014 | 10/2003 |
| JP | 2004-6750 | 1/2004 |
| JP | 2004-253681 | 9/2004 |
| JP | 2005-32774 | 2/2005 |
| JP | 2005-509299 | 4/2005 |
| WO | WO 2004091001 A1 * | 10/2004 |
| WO | WO 2005029605 A1 * | 3/2005 |
| WO | WO 2005086254 A1 * | 9/2005 |

OTHER PUBLICATIONS

Christos D. Dimitrakopoulos, et al., "Organic Thin Film Transistors for Large Area Electronics", Advanced Materials, vol. 14, No. 2, Jan. 16, 2002, pp. 99-117.

Kaname Ito, et al., "Oligo(2,6-anthrylene)s: Acene-Oligomer Approach for Organic Field-Effect Transistors", Angew. Chem. Int. Ed., vol. 42, No. 10, 2003, pp. 1159-1162.

* cited by examiner

SEMICONDUCTOR DEVICE WITH LAYER CONTAINING POLYSILOXANE COMPOUND

BACKGROUND OF THE INVENTION

1. Field of the Invention

The present invention relates to a semiconductor device having an organic semiconductor.

2. Description of the Related Art

The development of a thin film transistor using an organic semiconductor has gradually become active since the latter half of the 1980s. In addition, the basic performance of a thin film transistor using an organic semiconductor has recently exceeded the basic performance of a thin film transistor using amorphous silicon. An organic material can be easily processed in many cases, and often has a high affinity for a flexible plastic substrate on which a thin film field effect transistor (FET) is formed. Therefore, the organic material is an attractive material for a semiconductor layer in a device requested to have flexibility or a light weight. The following organic semiconductor materials have been heretofore investigated. A first example is an acene-based compound such as pentacene or tetracene disclosed in Japanese Patent Application Laid-Open No. H05-55568. A second example is any one of phthalocyanines each containing lead phthalocyanine disclosed in Japanese Patent Application Laid-Open No. H05-190877. A third example is a low-molecular weight compound such as perylene or a tetracarboxylic acid derivative of perylene. A fourth example is any one of: aromatic oligomers typified by a thiophene hexamer referred to as α-thienyl or sexithiophene disclosed in Japanese Patent Application Laid-Open No. H08-264805; and polymer compounds such as polythiophene, polythienylenevinylene, and poly-p-phenylenevinylene. It should be noted that most of those materials are described in Advanced Material, 2002, no. 2, p. 99 to 117.

Properties requested for producing a device using any one of those compounds in its semiconductor layer such as non-linear optical property, conductivity, and semiconductivity largely depend on not only the purity of a material for the device but also the crystallinity and orientation of the material. An organic material showing good semiconductor property is generally a compound with an expanded π conjugated system. Meanwhile, a compound with an expanded π conjugated system is generally insoluble or hardly soluble in a solvent. For example, pentacene has high crystallinity and is insoluble in a solvent, so a pentacene thin film is generally formed by employing a vacuum vapor deposition method. As a result, a pentacene thin film showing a high field effect mobility is obtained. However, when the vacuum vapor deposition method is employed, the good processability of an organic material is not sufficiently exerted because of, for example, the large size of an apparatus for the method and a long time period needed for the production of a film.

Meanwhile, there has been also reported an FET using a film obtained by: forming a thin film of a soluble precursor for pentacene through application; and transforming the precursor into pentacene through a heat treatment (see US 2003/0136964 A1).

Further, it has been reported that tetrabenzoporphyrin obtained by heating porphyrin, in which a bulky bicyclo [2.2.2]octadiene skeleton undergoes ring condensation, at 210° C. or higher can be used as an organic semiconductor (speech proceedings II of the 81st spring annual meeting of the Chemical Society of Japan, 2002, p. 990 (2F 9-14), Japanese Patent Application Laid-Open No. 2003-304014, and Japanese Patent Application Laid-Open No. 2004-6750).

Although the field effect mobility of an organic semiconductor layer described in any one of those documents is high, the high field effect mobility is realized merely on a silicon substrate or a glass substrate identical to amorphous silicon or the like. Meanwhile, the formation of an organic semiconductor layer stably showing a high mobility even on a resin substrate plays an important role in the realization of a flexible device taking advantage of the characteristics of an organic material.

A known method of forming an organic semiconductor layer stably showing a high mobility is a method involving controlling an interface between a gate insulating layer and the organic semiconductor layer. For example, in Japanese Patent Application Laid-Open No. 2005-32774, the threshold voltage of an organic semiconductor layer to be formed on a gate insulating layer is controlled by causing a silane compound having various substituents to chemically adsorb on the gate insulating layer. In this case, a uniform interface can be formed on an inorganic insulating layer made of $SiO_2$ or the like, but it has been difficult to cause a silane compound to chemically adsorb to the surface of an organic insulating layer. In addition, Japanese Patent Application Laid-Open No. 2005-509299 discloses a field effect transistor in which a layer composed of polydimethylsiloxane is formed between a gate insulating layer and an organic semiconductor layer. However, no material allowing the formation of a uniform polymer layer on an organic insulating layer and the formation of an organic semiconductor layer on the polymer layer through application has been found. Further investigation into the obtainment of an optimum crystalline orientation with a view to increasing a carrier mobility is probably needed for the obtainment of stable properties of an organic semiconductor even on a flexible substrate.

SUMMARY OF THE INVENTION

It is an object of the present invention to provide a semiconductor device having an organic semiconductor layer provided with excellent crystallinity and excellent orientation. It is another object of the present invention to provide a field effect transistor with a high field effect mobility. In addition, according to the present invention, there can be provided a method of producing a semiconductor device with which the above semiconductor device can be obtained through a simple process.

According to one aspect of the present invention, there is provided a semiconductor device including: a substrate; a layer containing one or more kinds of polymer compounds on the substrate; and an organic semiconductor layer in contact with the layer containing the one or more kinds of polymer compounds, in which at least one kind of the one or more kinds of polymer compounds is a polymer compound having one or more secondary or tertiary aliphatic amino groups, wherein the one or more aliphatic amino groups of the polymer compound having the aliphatic amino groups at least one of a side chain and a branched chain, and wherein the layer containing the one or more kinds of polymer compounds contains polysiloxane compounds.

Here, only one kind of a polymer compound may be used, or two or more kinds of polymer compounds may be used as a mixture. In addition, only one kind of the respective polymer compounds may have an aliphatic amino group, or two or more kinds of the polymer compounds may each have an aliphatic amino group. Each of the polymer compounds may have multiple kinds of amino groups in itself. Of course, neither use of a compound having a primary amino group nor use of a compound having no amino group is excluded as long as the requirements described in the scope of claims are satisfied.

Here, the term "polysiloxane compound" refers to a polymer having a siloxane structure (—Si—O—). In addition, the polysiloxane compounds to be used in the present invention each preferably have an organic silane structure. In addition, each of the polysiloxane compounds is preferably a polymer compound having one or more secondary or tertiary aliphatic amino groups. It is needless to say that each of the polysiloxane compounds may be used as a polymer compound except a polymer compound having one or more secondary or tertiary aliphatic amino groups.

In further aspect of the semiconductor device of the present invention, at least one kind of the polysiloxane compounds contains a structure represented by the following general formula (1):

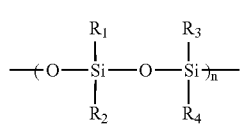

General formula (1)

where $R_1$ to $R_4$ each represent a substituted or unsubstituted alkyl group or alkenyl group having 1 to 8 carbon atoms, a substituted or unsubstituted phenyl group, or a siloxane unit; $R_1$ to $R_4$ may be identical to or different from one another; and n represents an integer of 1 or more.

The term "substituted or unsubstituted" as used in the specification and the scope of claims means that a hydrogen atom, methyl group, or methylene group in a group or unit of interest may be substituted by any other atom or group. Examples of the other atom or group include a halogen atom, a hydroxyl group, a cyano group, a phenyl group, a nitro group, a mercapto group, and a glycidyl group. When a methyl group or a methylene group is substituted, the number of carbon atoms refers to the number of carbon atoms after the substitution (that is, the actual number of carbon atoms).

In further aspect of the semiconductor device of the present invention, at least one kind of the polysiloxane compounds contains one of a structure represented by the following general formula (2) and a structure represented by the following general formula (3):

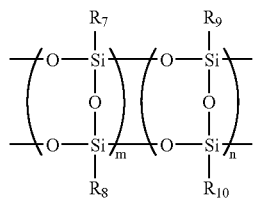

General formula (2)

where $R_7$ to $R_{10}$ each represent a substituted or unsubstituted alkyl group or alkenyl group having 1 to 8 carbon atoms, or a substituted or unsubstituted phenyl group; $R_7$ to $R_{10}$ may be identical to or different from each other; m and n each represent an integer of 0 or more; and a sum of m and n represents an integer of 1 or more;

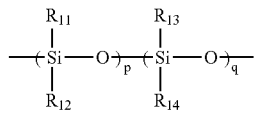

General formula (3)

where $R_{11}$ to $R_{14}$ each represent a substituted or unsubstituted alkyl group or alkenyl group having 1 to 8 carbon atoms, or a substituted or unsubstituted phenyl group; $R_{11}$ to $R_{14}$ may be identical to or different from each other; p and q each represent an integer of 0 or more; and a sum of p and q represents an integer of 1 or more.

The term "or" is a concept including the term "and". Therefore, it is needless to, say that the case where at least one kind of the polysiloxane compounds has both the structure represented by the general formula (2) and the structure represented by the general formula (3) is also included in the present invention.

In further aspect of the semiconductor device of the present invention, at least one kind of the polysiloxane compounds contains one or more of siloxane structures represented by the following general formula (4), the following general formula (5), and the following general formula (6):

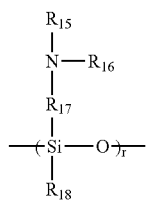

General formula (4)

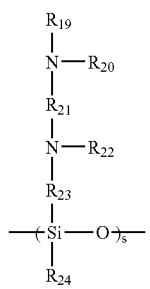

General formula (5)

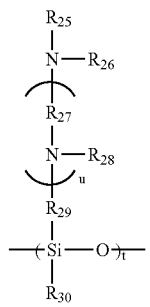

General formula (6)

where $R_{15}$, $R_{16}$, $R_{19}$, $R_{20}$, $R_{22}$, $R_{25}$, $R_{26}$, and $R_{28}$ each independently represent a hydrogen atom, a substituted or unsubstituted alkyl group, alkenyl group, or alkynyl group having 1 to 12 carbon atoms, a benzyl group, a phenethyl group, or a styryl group; any one combination of $R_{15}$ and $R_{16}$, $R_{19}$ and $R_{20}$, $R_{19}$ and $R_{22}$, and $R_{25}$ and $R_{26}$ may bind to each other to form a ring structure; one of $R_{15}$ and $R_{16}$ represents a substituent except a hydrogen atom; $R_{17}$, $R_{21}$, $R_{23}$, $R_{27}$, and $R_{29}$ each represent a divalent organic group which has 1 to 12 carbon atoms and which is not directly bound to an aromatic ring; $R_{18}$, $R_{24}$, and $R_{30}$ each represent a hydroxyl group, a substituted or unsubstituted alkyl group, alkenyl group, alkynyl group, or alkoxyl group having 1 to 12 carbon atoms, a benzyl group, a phenethyl group, a styryl group, or a siloxane unit; r, s, and t each represent an integer of 1 or more; and u represents an integer of 2 or more.

In further aspect of the semiconductor device of the present invention, at least one kind of the polysiloxane compounds contains one or more of silsesquioxane structures each containing a skeleton represented by any one of the following general formula (7), the following general formula (8), and the following general formula (9):

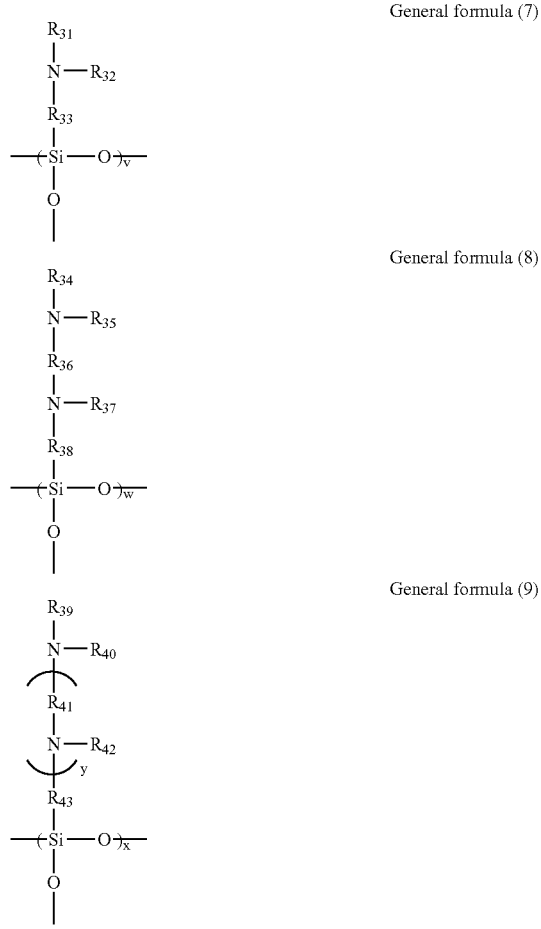

General formula (7)

General formula (8)

General formula (9)

where $R_{31}$, $R_{32}$, $R_{34}$, $R_{35}$, $R_{37}$, $R_{39}$, $R_{40}$, and $R_{42}$ each independently represent a hydrogen atom, a substituted or unsubstituted alkyl group, alkenyl group, or alkynyl group having 1 to 12 carbon atoms, a benzyl group, a phenethyl group, or a styryl group; any one combination of $R_{31}$ and $R_{32}$, $R_{34}$ and $R_{35}$, $R_{34}$ and $R_{37}$, and $R_{39}$ and $R_{40}$ may bind to each other to form a ring structure; one of $R_{31}$ and $R_{32}$ represents a substituent except a hydrogen atom; $R_{33}$, $R_{36}$, $R_{38}$, $R_{41}$, and $R_{43}$ each represent a divalent organic group which has 1 to 12 carbon atoms and which is not directly bound to an aromatic ring; v, w, and x each represent an integer of 1 or more, and y represents an integer of 2 or more.

In further aspect of the semiconductor device of the present invention, the organic semiconductor layer is composed of a low-molecular weight organic semiconductor.

In further aspect of the semiconductor device of the present invention, the organic semiconductor layer is composed of one of an acene-based compound and a porphyrin compound.

In further aspect of the semiconductor device of the present invention, a surface opposite to a surface of the layer containing the one or more kinds of polymer compounds in contact with the organic semiconductor layer is in contact with an organic resin layer.

An appropriate combination of the foregoing characteristics is also within the scope of the present invention.

Further features of the present invention will become apparent from the following description of exemplary embodiments (with reference to the attached drawings).

DESCRIPTION OF THE EMBODIMENTS

According to the present invention, there can be provided a semiconductor device excellent in crystallinity and orientation.

The present invention is additionally effective when a semiconductor device is a field effect transistor because a semiconductor device having a high field effect mobility can be obtained.

Hereinafter, the present invention will be described in detail by taking a field effect transistor as an example of a semiconductor device. It is needless to say that an effect of the present invention is valid for not only a field effect transistor but also a general semiconductor device. In addition, a numeral provided for a member the description of which is omitted in each figure to which reference is made indicates a member having the same numeral as that provided for a figure to which reference is made in the following description of the present invention.

A field effect transistor according to this embodiment is a device having at least an organic semiconductor, an insulator, and conductors. The insulator is an insulating film (i.e., layer) for covering the conductors serving as electrodes. The organic semiconductor is an organic semiconductor layer that responds to a stimulus (i.e., electric field) generated by the conductor (i.e., electrode). To be specific, the organic semiconductor layer is a layer, the electrical characteristics of which change with an electric field. To be more specific, the organic semiconductor layer is a layer, the conductivity of which, that is, the amount of a current passing through the organic semiconductor layer, changes with a change in electric field.

Figure 1A:
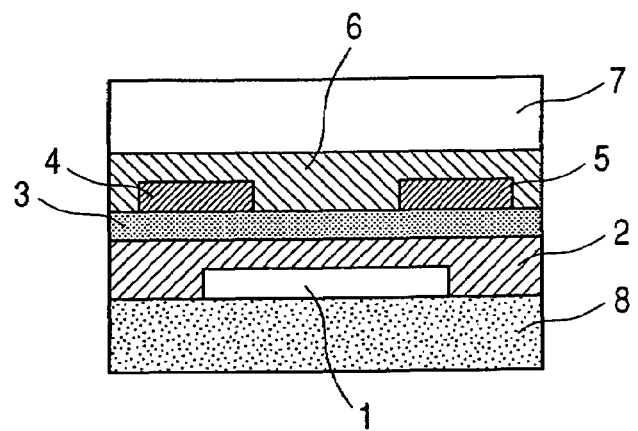
FIGS. 1A, 1B and 1C are each a schematic sectional view showing an example of a field effect transistor as a preferred embodiment of the present invention.

FIG. 1A is a schematic sectional drawing showing an example of the field effect transistor according to this embodiment. Reference numeral 8 represents a substrate; 1, a gate electrode; 2, a gate insulating layer; 3, a polymer compound-containing layer; 4, a source electrode; 5, a drain electrode; 6, an organic semiconductor layer; and 7, a sealing layer. In the device, the gate electrode 1 is provided on the surface of the substrate 8, the gate insulating layer 2 is provided on the gate electrode 1, the polymer compound-containing layer 3 is provided on the surface of the gate insulating layer 2, and the source electrode 4 and the drain electrode 5 are provided on a surface of the polymer compound-containing layer 3 so as to be separated from each other. In addition, the organic semiconductor layer 6 is provided on the source electrode 4, the drain electrode 5, and the polymer compound-containing layer serving as a separation region between the electrodes, so as to be in contact with both the electrodes 4 and 5. The gate insulating layer 2 is provided to cover the gate electrode 1. Further, the organic semiconductor layer 6 is covered with the sealing layer 7. The substrate 8 and the sealing layer 7 may be interchanged with each other.

In the field effect transistor, when a voltage is applied to the gate electrode, positive or negative charge is induced at a region in the vicinity of an interface between the gate insulating layer and the organic semiconductor layer. (In this way, the region where charge is induced is called channel.) Further, when a voltage is applied between the source electrode and the drain electrode, charge moves between both the electrodes through the channel, thereby generating a current. Therefore, if charge is uniformly generated at the channel when a voltage is applied to the gate electrode, barriers become small and therefore charge can be moved efficiently when a voltage is applied between the source electrode and the drain electrode, thereby making the transistor exhibit a high field effect mobility.

The inventors of the present invention have made extensive studies to find a method of forming an organic semiconductor layer interface which allows charge to be uniformly generated and allows the generated charge to move efficiently. As a result, the inventors have found that, a specific polymer-containing layer 3 is formed so as to be adjacent to the channel (near the interface on the side of the gate insulating layer 2 of the organic semiconductor layer 6 in FIG. 1A), whereby a crystal which is uniform with little defects can be continuously formed at the interface, so a high field effect mobility is exhibited.

A field effect transistor as a preferred embodiment of the present invention includes at least: a substrate; a layer containing one or more kinds of polymer compounds on the substrate; and an organic semiconductor layer in contact with the layer containing the one or more kinds of polymer compounds, in which at least one kind of the one or more kinds of polymer compounds is a polymer compound having one or more secondary or tertiary aliphatic amino groups.

The layer containing the one or more kinds of polymer compounds of the present invention has only to contain a polymer compound having one or more secondary or tertiary aliphatic amino groups, and may contain two or more kinds of polymer compounds as long as the layer maintains sufficient uniformity. Examples of the case where the layer contains two or more kinds of polymer compounds include: the case where the layer simultaneously contains two or more kinds of polymer compounds each having one or more secondary or tertiary aliphatic amino groups; and the case where the layer simultaneously contains one or more kinds of polymer compounds each having one or more secondary or tertiary aliphatic amino groups and one or more kinds of polymer compounds each having none of a secondary aliphatic amino group and a tertiary aliphatic amino group. It is needless to say that the other cases are also within the scope of the present invention.

In the field effect transistor as a preferred embodiment of the present invention, a polymer layer containing a polymer compound having one or more secondary or tertiary aliphatic amino groups (herein after referred to as "A layer") and the organic semiconductor layer (hereinafter referred to as "B layer") are preferably laminated so that the layers are brought into close contact with each other in part, or the entire surface, of the device, that is, the transistor. Here, the term "close contact" refers to a state where the A layer and the B layer are adjacent to each other with no gap at least partially. The crystallization of the B layer is promoted by laminating the A layer so that the A layer is brought into close contact with the B layer, whereby the field effect transistor of the present invention shows a high field effect mobility. Accordingly, the A layer can be generally referred to as a crystallization promoting layer. It should be noted that the term "crystallization promoting layer" as used in the scope of claims and the specification is defined as a layer that not only merely promotes crystallization but also has such crystallization promoting function as described later.

In addition, as described later, the use of a solvent-soluble organic semiconductor material or organic semiconductor precursor enables each of the A layer and the B layer to be produced by using an applying step, so a device can be produced through a simple process.

It should be noted that, according to the present invention, a base structure on which the A layer is formed (the structure is generally a structure composed of a substrate, a gate electrode, and a gate insulating layer. Note that, the gate insulating layer can be omitted in some cases, the structure can be composed only of the substrate depending on a lamination order, or other layers may be formed in the structure) may be referred to as a substrate. In addition, according to the present invention, the term "function of promoting crystallization" refers to a function of promoting stabilization of crystal grains (which may involve the movement and rotation of the crystal grains) and/or bonding between the crystal grains. In addition, according to the present invention, the term "crystallization promoting layer" refers to a layer promoting stabilization of crystal grains (which may involve the movement and rotation of the crystal grains) and/or bonding between the crystal grains.

Hereinafter, the B layer is formed on the A layer. However, the present invention is not limited thereto. It is preferable to form the B layer on the A layer from the viewpoint of imparting an influence of the A layer during the formation of the B layer.

A polymer compound of the present invention has only to have one or more secondary or tertiary aliphatic amino groups. An excessive carrier derived from an impurity and present at an interface between the A layer and a gate insulating layer can be trapped owing to an effect of the basicity of an amino group. As a result, an off-state, current can be suppressed, and an On/Off ratio can be increased. However, a primary aliphatic amino group has high hydrophilicity. Accordingly, when one attempts to obtain the effect, the hydrophobicity of the surface of the A layer is lost, with the result that a promoting, effect on the crystallization of the organic semiconductor layer is lost. On the other hand, a secondary or tertiary aliphatic amino group has high hydrophobicity because a nitrogen atom is substituted by a group except hydrogen such as an alkyl group. Accordingly, amino groups are not unevenly distributed on the surface of the A layer, a reduction in hydrophobicity can be prevented, and an excessive carrier migrating from the interface between the A layer and the gate insulating layer can be trapped in the A layer. As a result, a suppressing effect on an off-state current becomes large. The secondary or tertiary aliphatic amino group described here is a group represented by each of the following formulae where R's each represent an alkyl group, an alkenyl group, an alkynyl group, or a substituent an aromatic ring of which is not directly connected to the nitrogen atom of an amino group such as a benzyl group, a phenethyl group, or a styryl group. More specifically, R's may each represent an arbitrary substituent unless R's are directly connected to any one of a hydrogen atom, an aromatic ring, a carbonyl group, and a sulfonyl group. In addition, R's may bind to each other to form a ring structure, or R's may form a double bond between them to provide an imino group. However, when R's bind to each other to form a ring structure, an aromatic heterocyclic ring such as a pyridine ring, a pyrazine ring, or a triazine ring is excluded. One or more of R's each represent an organic group which is divalent or more, and an amino group is incorporated into the molecular chain of a polymer through the organic group. Suitable examples of the remaining R includes, but not limited to, an alkyl group, an alkenyl group, an alkynyl group, a benzyl group, a phenethyl group, and a styryl group. It should be noted that the basicity constant Kb of an amino group is preferably $1 \times 10^{-7}$ to $1 \times 10^{-2}$ because the amino group must have some degree of basicity for suppressing an off-state current. Therefore, a polymer compound having one or more secondary or tertiary aliphatic amino groups is used in the A layer of the present invention.

The number of moles of a secondary or tertiary amino group in 100 g of the polymer compound having an aliphatic amino group of the present invention is preferably of 0.003 or more to 0.4 or less. When the number of moles is less than 0.003, secondary or tertiary amino groups are hardly uniformly present on the surface of the A layer, so the crystal growth of the B layer may be nonuniform. When the number of moles exceeds 0.4, the surface of the A layer is made hydrophilic, so a crystallization promoting effect may be lost.

The polymer compound containing a secondary or tertiary aliphatic amino group may additionally have a primary amino group as long as the compound has one or more secondary or tertiary aliphatic amino groups.

The polymer compound having an aliphatic amino group of the present invention refers to an oligomer or polymer having a number average molecular weight of preferably 200 or more. The number average molecular weight is more preferably 500 or more to 1,000,000 or less. The structure of the oligomer or polymer may be any one of a linear structure, a cyclic structure, a branched structure, a ladder type structure, a crosslinked structure, and a dendrimer structure, and these structures can be arbitrarily combined.

The polymer compound having an aliphatic amino group of the present invention has only to have one or more secondary or tertiary aliphatic amino groups in at least one molecular chain selected from a main chain, a side chain, or a branched chain. Here, the case where the compound has an aliphatic amino group in a branched chain refers to the case where it is hard to determine which chain is a main chain or a side chain such as the case where the polymer compound has a dendritic structure.

Examples of a polymer compound having a secondary or tertiary aliphatic amino group in the main chain include polyalkyleneamines such as polyethylene imine, and copolymers of the polyalkyleneamines. In addition, the main skeleton of a polymer compound having a secondary or tertiary aliphatic amino group in a side chain can be selected from arbitrary skeletons such as polyacrylate, polymethacrylate, polyvinyl ether, polystyrene, polycycloolefin, polyether, polyester, polyallylate, polyamide, polyamideimide, polyimide, polyketone, polysulfone, polyphenylene, polysilicon, polysiloxane, cyclic polysiloxane, and ladder type polysiloxane, and copolymers obtained by combining these skeletons. Examples of the main skeleton of a polymer compound having a secondary or tertiary aliphatic amino group in a branched chain include a polyamideamine dendrimer and hyper-branched polyamide.

It is more preferable that one or more secondary or tertiary aliphatic amino groups be bound to at least one of a side chain and a branched chain. The presence of secondary or tertiary aliphatic amino groups on at least one of a side chain and a branched chain enables amino groups to be uniformly present near the surface of the A layer upon formation of the A layer. As a result, both an excessive carrier derived from an impurity at an interface between the A layer and the B layer and an excessive carrier derived from an impurity and migrating from the gate insulating layer can be efficiently trapped. In addition, at least one of a side chain and a branched chain each having a secondary or tertiary aliphatic amino group exerts an additional promoting effect on crystal growth.

A more preferable example of the polymer compound having an aliphatic amino group of the present invention is a polymer compound having a siloxane skeleton. The polymer compound having a siloxane skeleton is a polymer having a siloxane structure (—Si—O—) and an organic silane structure. That is, a polysiloxane compound may be a copolymer with any other organic polymer or inorganic polymer as long as the compound has those structures. In the case of a copolymer with any other polymer, each of the siloxane structure and the organic silane structure may be present in a main chain, or may be present in a side chain owing to, for example, graft polymerization. The combination of the siloxane structure (—Si—O—) and the organic silane structure can aid the crystallization promoting effect of a secondary or tertiary aliphatic amino group. It should be noted that the organic silane structure is a structure in which Si and C are directly bound to each other.

Potential examples of the structure of the polysiloxane compound to be suitably used in the present invention include various structures such as a straight-chain structure and a cyclic structure. The polysiloxane compound of the present invention more preferably has a highly crosslinked or branched structure. The term "highly crosslinked or branched structure" as used herein includes a network-like structure, a ladder-like structure, a cage-like structure, a star-like structure, and a dendritic structure. There is no need to form the crosslinked or branched structure through a siloxane structure, and a structure in which organic groups such as a vinyl group, an acryloyl group, an epoxy group, and a cinnamoyl group mutually crosslink is also included in the structure. In addition, the structure may include a structure branched through an organic group which is trivalent or more.

In the layer of the polysiloxane compound to be suitably used in the present invention, amino groups can be uniformly distributed in the polysiloxane compound by introducing a secondary or tertiary aliphatic amino group into a highly crosslinked or branched structure at the time of polymerization. Further, unlike a monomolecular layer obtained by causing an active group on the surface of a base material to react with octyltrichlorosilane, hexamethyldisilazane, aminopropyltrialkoxysilane, or the like, the uniform distribution does not depend on the state or shape of the surface of a substrate. As a result, an amorphous layer can be formed on a wide area. Accordingly, the interface between the A layer and the B layer becomes uniform in a wide range comparable to or larger than at least a region in which a channel is formed. In addition, as a result of coupling with an effect of the combination of the siloxane structure and the organic silane structure described above, a continuously uniform crystal having a small number of defects is formed.

The polysiloxane compound to be suitably used for the A layer in the present invention has, for example, a structure represented by the following general formula (1) and its main chain is a siloxane unit and any one of its side chains is a substituent having a hydrogen atom or an organic group such as a carbon atom.

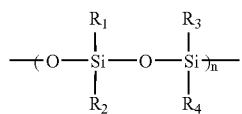

General formula (1)

where $R_1$ to $R_4$ each represent a substituted or unsubstituted alkyl group or alkenyl group having 1 to 8 carbon atoms, a substituted or unsubstituted phenyl group, or a siloxane unit; $R_1$ to $R_4$ may be identical to or different from each other; n represents an integer of preferably 1 or more, or more preferably 5 or more to 100,000 or less, and it may be impossible to form the A layer which is thin and uniform when n is less than 5 or larger than 100,000.

Each of the substituents $R_1$ to $R_4$ may be the siloxane units such as those shown below.

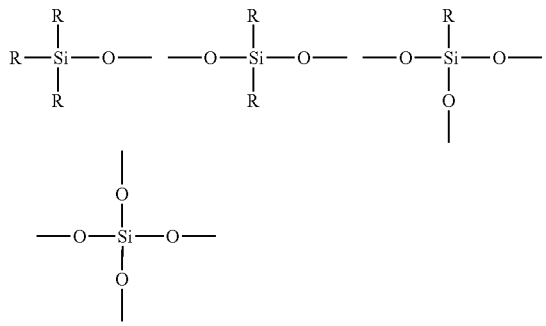

In the formulae, R's each represent a substituted or unsubstituted alkyl group or alkenyl group having 1 to 8 carbon atoms, a substituted or unsubstituted phenyl group, or a siloxane unit as shown above. R's may be the same functional group or may be different functional groups, respectively.

The shape of the polysiloxane may be of a linear structure, a cyclic structure, a network-like structure, a ladder-like structure, a cage-like structure, or the like, depending on the kinds of substituents in the general formula (1). The polysiloxane to be used in the present invention may be of any of the structures. It is preferable that the shape of the polysiloxane be of the network structure, the ladder-like structure, or the cage-like structure.

Particularly preferable as the polysiloxane compound to be used for the A layer in the present invention is a polysiloxane compound having at least a specific silsesquioxane skeleton represented by the following general formula (2) and/or a specific organosiloxane skeleton represented by the following general formula (3).

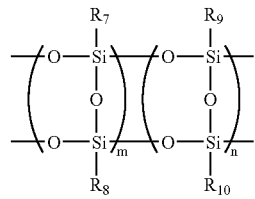

General formula (2)

In the formula, $R_7$ to $R_{10}$ each represent a substituted or unsubstituted alkyl group or alkenyl group having 1 to 8 carbon atoms, or a substituted or unsubstituted phenyl group. $R_7$ to $R_{10}$ may be identical to or different from each other. Integers m and n each represent an integer of 0 or more, and the sum of m and n represents an integer of 1 or more. A copolymerization form may be random copolymerization or block copolymerization.

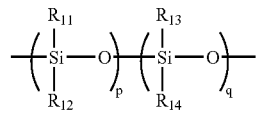

General formula (3)

In the formula, $R_{11}$ to $R_{14}$ each represent a substituted or unsubstituted alkyl group or alkenyl group having 1 to 8 carbon atoms, or a substituted or unsubstituted phenyl group. $R_{11}$ to $R_{14}$ may be identical to or different from each other. Integers p and q each represent an integer of 0 or more, and the sum of p and q represents an integer of 1 or more.

The polysiloxane compound may contain one or both of the silsesquioxane skeleton represented by the general formula (2) and the organosiloxane skeleton represented by the general formula (6).

In addition, the substituents $R_7$ to $R_{10}$ and $R_{11}$ to $R_{14}$ having carbon atoms corresponding to the side chains of the silsesquioxane skeleton and the organosiloxane skeleton each represent a substituted or unsubstituted alkyl group or alkenyl group having 1 to 8 carbon atoms, or a substituted or unsubstituted phenyl group. Those substituents may be the same functional group or may be different functional groups depending on sites. Examples of such a functional group include: an unsubstituted alkyl group such as a methyl group or an ethyl group; an unsubstituted phenyl group; and a substituted phenyl group such as a dimethylphenyl group or a naphthyl group. The substituents $R_7$ to $R_{10}$ each may contain various atoms such as an oxygen atom, a nitrogen atom, and a metal atom as well as a carbon atom and a hydrogen atom.

The general formula (2) represents a structural formula having a structure in which m silsesquioxane units (hereinafter, referred to as first units) each having the substituents $R_7$ and $R_8$ are repeated and a structure in which n silsesquioxane units (hereinafter, referred to as second units) each having the substituents $R_9$ and $R_{10}$ are repeated are connected. It should be noted that integers m and n each represent an integer of 0 or more, and the sum of m and n represents an integer of 1 or more. The formula does not mean that the repeated first units and the repeated second units are separated. Both the units may be separately connected or may be connected while being intermingled at random.

The general formula (3) shows a structural formula in which p repetitive diorganosiloxane units each having the substituents $R_{11}$ and $R_{12}$ (hereinafter referred to as "first units") and q repetitive diorganosiloxane units each having the substituents $R_{13}$ and $R_{14}$ (hereinafter referred to as "second units") are connected. It should be noted that p and q each represent an integer of 0 or more and the sum of p and q represents an integer of 1 or more. However, this does not mean that the repetition of the first units and the repetition of the second units are separated from each other. Both units may be connected to each other while being separated from each other, or may be connected to each other while being mixed with each other at random.

In addition, a secondary or tertiary amino group can be introduced into the polysiloxane compound to be used in the present invention when the compound contains at least one of siloxane structures each represented by, for example, the following general formula (4), the following general formula (5), or the following general formula (6):

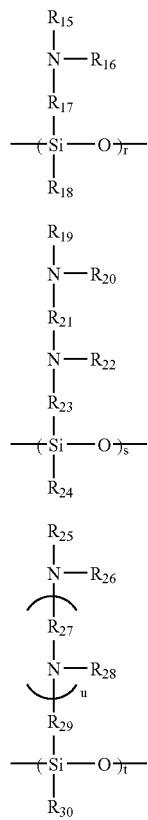

where $R_{15}$, $R_{16}$, $R_{19}$, $R_{20}$, $R_{22}$, $R_{25}$, $R_{26}$, and $R_{28}$ each independently represent a hydrogen atom, a substituted or unsubstituted alkyl group, alkenyl group or alkynyl group having 1 to 12 carbon atoms, a benzyl group, a phenethyl group, or a styryl group; any one combination of $R_{15}$ and $R_{16}$, $R_{19}$ and $R_{20}$, $R_{19}$ and $R_{22}$, and $R_{25}$ and $R_{26}$ may bind to each other to form a ring structure; one of $R_{15}$ and $R_{16}$ represents a substituent except a hydrogen atom; $R_{17}$, $R_{21}$, $R_{23}$, $R_{27}$, and $R_{29}$ each represent a divalent organic group which has 1 to 12 carbon atoms and which is not directly bound to an aromatic ring; $R_{18}$, $R_{24}$, and $R_{30}$ each represent a hydroxyl group, a substituted or unsubstituted alkyl group, alkenyl group, alkynyl group, or alkoxyl group having 1 to 12 carbon atoms, a benzyl group, a phenethyl group, a styryl group, or a siloxane unit; r, s, and t each represent an integer of 1 or more; and u represents an integer of 2 or more.

A polysiloxane compound containing at least one of silsesquioxane structures each represented by the following general formula (7), the following general formula (8), or the following general formula (9) is particularly preferably used in the A layer:

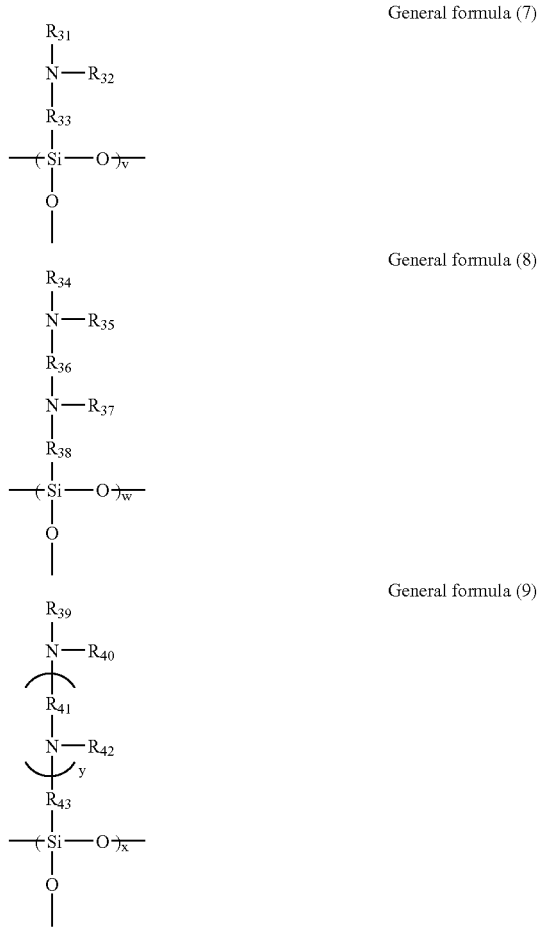

where $R_{31}$, $R_{32}$, $R_{34}$, $R_{35}$, $R_{37}$, $R_{39}$, $R_{40}$, and $R_{42}$ each independently represent a hydrogen atom, a substituted or unsubstituted alkyl group, alkenyl group, or alkynyl group having 1 to 12 carbon atoms, a benzyl group, a phenethyl group, or a styryl group; any one combination of $R_{31}$ and $R_{32}$, $R_{34}$ and $R_{35}$, $R_{34}$ and $R_{37}$, and $R_{39}$ and $R_{40}$ may bind to each other to form a ring structure; one of $R_{31}$ and $R_{32}$ represents a substituent except a hydrogen atom; $R_{33}$, $R_{36}$, $R_{38}$, $R_{41}$, and $R_{43}$ each represent a divalent organic group which has 1 to 12 carbon atoms and which is not directly bound to an aromatic ring; v, w, and x each represent an integer of 1 or more; and y represents an integer of 2 or more.

One kind of those polysiloxane compounds can be used alone, or multiple kinds of them can be blended before use. In addition, one polysiloxane compound may have multiple kinds of the above units. In addition, one or more polysiloxane compounds may be blended with any other polymer compound or low-molecular weight compound.

Hereinafter, a method of forming the A layer of the present invention from the above polysiloxane compound will be described.

A preferable example of the A layer in the present invention is a layer mainly containing a polysiloxane compound having at least one of such silsesquioxane skeleton as represented by the general formula (2) and such organosiloxane skeleton as represented by the general formula (3). Examples of a method of forming such layer include a method involving: applying, onto a substrate, a solution containing polyorganosilsesquioxane compounds represented by the following general formula (10) and the following general formula (11) or one of the formulae and/or polyorganosiloxane compounds represented by the following general formula (12) and the following general formula (13) or one of the formulae; and drying the applied film under heat. The examples further include a method involving: applying, onto a substrate, a sol obtained by hydrolyzing a silicon monomer in which the numbers of repetition a, b, c, and d each represent 1 among the compounds represented by the following general formulae (10), (11), (12), and (13); and drying the applied sol under heat.

In the former method involving drying the applied film under heat, the polyorganosilsesquioxane compounds represented by the general formula (10) and the general formula (11) are condensed by a dehydration or dealcoholization reaction to be connected in a ladder fashion. On the other hand, the polyorganosiloxane compounds represented by the following general formula (12) and the following general formula (13) are similarly condensed by a dehydration or dealcoholization reaction to provide an increased molecular weight. At this time, however, the temperature at which the applied film is dried is not so high that organic matter completely disappears. Accordingly, a raw material compound obtains not a complete silica structure but a silsesquioxane skeleton or organosiloxane skeleton as represented by the general formula (2) or (3) in which most part of substituents remain.

The polyorganosilsesquioxane compounds represented by the general formulae (10) and (11) and the polyorganosiloxane compounds represented by the general formulae (12) and (13) may be those commercially available. Those polyorganosilsesquioxane compounds and the polyorganosiloxane compounds may be synthesized via reactions represented by the following reaction formulae (14) and (15).

Reaction formula (14)

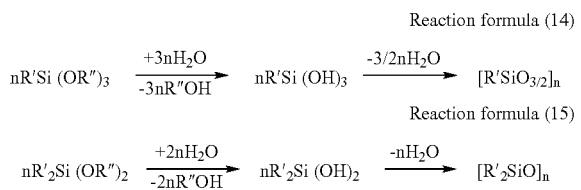

Reaction formula (15)

The above-mentioned reaction formulae (14) and (15) will be described. A trifunctional organic silicon monomer and/or a bifunctional organic silicon monomer each having an organic group R' are/is hydrolyzed in a solvent such as alcohol to produce a silanol compound. The silicon monomer shown in the above-mentioned reaction formulae is an alkoxide from which R"OH is eliminated by hydrolysis. A chloride of the silicon monomer may also be used, however, in this case, hydrogen chloride is generated as an eliminated component. The silanol compound obtained by hydrolysis is further subjected to dehydration condensation through heating or the like to produce a polyorganosilsesquioxane compound and a polyorganosiloxane compound. Removal of the solvent, a catalyst, and the like leads to the isolation of the polyorganosilsesquioxane compound and the polyorganosiloxane compound as solids. The structures, molecular weights, kinds of terminal groups, and the like of the resultant compounds can be changed by a catalyst, a solvent, a pH, a concentration, and the like employed at the time of the reactions.

General formula (10)

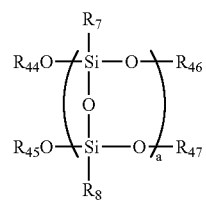

where $R_7$ and $R_8$ each represent a substituted or unsubstituted alkyl group or alkenyl group having 1 to 8 carbon atoms, or a substituted or unsubstituted phenyl group; $R_7$ and $R_8$ may be identical to or different from each other; $R_{44}$ to $R_{47}$ each represent an alkyl group having 1 to 4 carbon atoms or a hydrogen atom; and a represents an integer of 1 or more.

General formula (11)

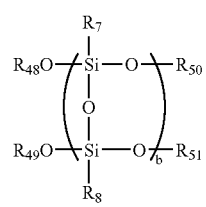

where $R_9$ and $R_{10}$ each represent a substituted or unsubstituted alkyl group or alkenyl group having 1 to 8 carbon atoms, or a substituted or unsubstituted phenyl group; $R_9$ and $R_{10}$ may be identical to or different from each other; $R_{48}$ to $R_{51}$ each represent an alkyl group having 1 to 4 carbon atoms or a hydrogen atom; and b represents an integer of 1 or more.

General formula (12)

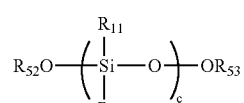

where $R_{11}$ and $R_{12}$ each represent a substituted or unsubstituted alkyl group or alkenyl group having 1 to 8 carbon atoms, or a substituted or unsubstituted phenyl group; $R_{11}$ and $R_{12}$ may be identical to or different from each other; $R_{52}$ and $R_{53}$ each represent an alkyl group having 1 to 4 carbon atoms or a hydrogen atom; and c represents an integer of 1 or more.

General formula (13)

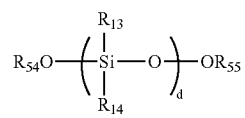

where $R_{13}$ and $R_{14}$ each represent a substituted or unsubstituted alkyl group or alkenyl group having 1 to 8 carbon atoms, or a substituted or unsubstituted phenyl group; $R_{13}$ and $R_{14}$ may be identical to or different from each other; $R_{54}$ and $R_{55}$ each represent an alkyl group having 1 to –4 carbon atoms or a hydrogen atom; and d represents an integer of 1 or more.

The method involving applying a sol obtained by hydrolyzing a silicon monomer onto a substrate and drying the applied sol under heat will be described. The silicon monomer described herein includes the trifunctional silicon monomer shown in the general formulae (16), (17), (18), and (19) and/or the bifunctional silicon monomer shown in the reaction formulae (20) and (21), which are/is stirred in a solvent in the coexistence of water at room temperature or under heat, whereby sol is prepared through hydrolysis and dehydration condensation reactions similar to those in the reaction formulae (14) and (15). Heating of the applied film of the resultant sol leads to condensation of silanol and unreacted alkoxides through a dehydration or dealcoholization reaction. Thus, a dense silsesquioxane or organosiloxane skeleton such as one represented by the general formula (2) or (3) is formed.

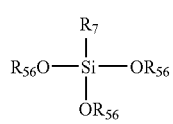

General formula (16)

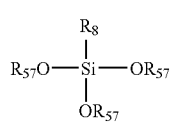

Generla formula (17)

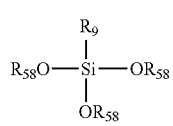

General formula (18)

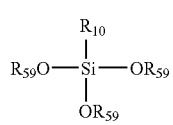

Generla formula (19)

where $R_7$ to $R_{10}$ each represent a substituted or unsubstituted alkyl group or alkenyl group having 1 to 8 carbon atoms, or a substituted or unsubstituted phenyl group; $R_7$ to $R_{10}$ may be identical to or different from each other; and $R_{56}$ to $R_{59}$ each represent an alkyl group having 1 to 4 carbon atoms or a hydrogen atom.

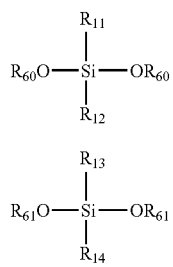

General Formula (20)

General Formula (21)

where $R_{11}$ to $R_{14}$ each represent a substituted or unsubstituted alkyl group or alkenyl group having 1 to 8 carbon atoms, or a substituted or unsubstituted phenyl group; $R_{11}$ to $R_{14}$ may be identical to or different from each other; and $R_{60}$ and $R_{61}$ each independently represent an alkyl group having 1 to 4 carbon atoms or a hydrogen atom.

Representative examples of a silicon monomer that can be used for preparing a sol include a trifunctional silicon monomer and a bifunctional silicon monomer. Examples of the trifunctional silicon monomer include methyltrimethoxysilane, methyltriethoxysilane, ethyltrimethoxysilane, ethyltriethoxysilane, butyltrimethoxysilane, vinyltrimethoxysilane, 3-aminopropyltriethoxysilane, and phenyltrimethoxysilane. Examples of the bifunctional silicon monomer include dimethyldimethoxysilane and diphenyldimethoxysilane.

In addition, a small amount of fluorine-containing silicon monomer such as trifluoropropyltrimethoxysilane, heptadecafluorodecyltrimethoxysilane, or tridecafluorooctyltrimethoxysilane can be added.

Water is preferably added upon preparation of a sol. The pH of a solution changes depending on the concentration of an amino group in the polymer of the present invention and on the addition amount of water, whereby the hydrolysis of a monomer is promoted. The addition amount of water is 0.1 to 20 equivalents with respect to an OR" group of the monomer in the reaction formula (14) or the reaction formula (15).

In addition, a polyorganosilsesquioxane compound represented by the general formula (10) or the general formula (11), a polyorganosiloxane compound represented by the general formula (12) or the general formula (13), and a silicon monomer in the reaction formula (14) or the reaction formula (15) can be used as a mixture in this case, as in the case of the preparation of a sol, water can be added. The addition amount of water is preferably 0.1 to 20 equivalents with respect to an OR" group of the monomer.

Further, a tetrafunctional silicon monomer such as tetramethoxysilane or tetraethoxysilane can be used in combination for improving application property or solvent resistance after heating.

A method of introducing a secondary or tertiary amino group into the above polysiloxane compound of which the A layer of the present invention is formed will be described.

The general formulae (4), (5), and (6) each represent a structure in polysiloxane of which the A layer is formed, and the polysiloxane preferably contains at least one of the structures each represented by any one of the general formulae (4), (5), and (6). $R_{15}$, $R_{16}$, $R_{19}$, $R_{20}$, $R_{22}$, $R_{25}$, $R_{26}$, and $R_{28}$ may represent substituents different from each other, and $R_{15}$ and $R_{16}$, $R_{19}$ and $R_{20}$, or $R_{25}$ and $R_{26}$ may bind to each other to form a ring structure; provided that one of $R_{15}$ and $R_{16}$ represents a substituent except a hydrogen atom. When the polysiloxane contains two or more structures each represented by any one of the general formulae (4), (5), and (6), the polysiloxane can contain two or more different kinds of structures.

A structure represented by any one of the general formulae (4), (5), and (6) can be introduced into the polysiloxane of which the A layer of the present invention is formed by using a silane compound represented by any one of the following general formulae (22), (23), and (24):

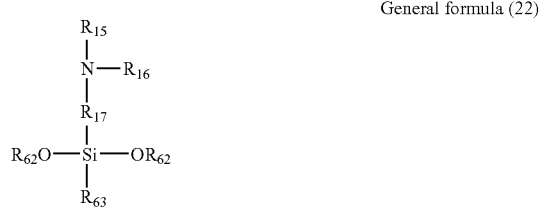

General formula (22)

-continued

General formula (23)

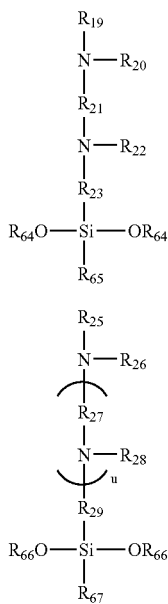

General formula (24)

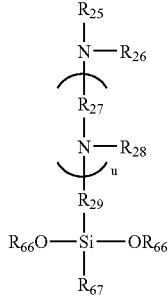

where $R_{15}$, $R_{16}$, $R_{19}$, $R_{20}$, $R_{22}$, $R_{25}$, $R_{26}$, and $R_{28}$ each independently represent a hydrogen atom, a substituted or unsubstituted alkyl group, alkenyl group, or alkynyl group having 1 to 12 carbon atoms, a benzyl group, a phenethyl group, or a styryl group; any one combination of $R_{15}$ and $R_{16}$, $R_{19}$ and $R_{20}$, $R_{19}$ and $R_{22}$, and $R_{25}$ and $R_{26}$ may bind to each other to form a ring structure; one of $R_{15}$ and $R_{16}$ represents a substituent except a hydrogen atom; $R_{17}$, $R_{21}$, $R_{23}$, $R_{27}$, and $R_{29}$ each represent a divalent organic group which has 1 to 12 carbon atoms and which is not directly bound to an aromatic ring; $R_{62}$, $R_{64}$, and $R_{66}$ each represent an alkyl group having 1 to 4 carbon atoms or a hydrogen atom; $R_{63}$, $R_{65}$, and $R_{67}$ each represent a hydroxyl group, a substituted or unsubstituted alkyl group, alkenyl group, alkynyl group, or alkoxyl group having 1 to 5 carbon atoms, or substituted or unsubstituted phenyl group; r, s, and t each represent an integer of 1 or more; and u represents an integer of 2 or more.

A method of forming the A layer of the present invention from polysiloxane having a structure represented by any one of the general formulae (4), (5), and (6) is similar to the method of forming the A layer composed of a polyorganosilsesquioxane compound represented by the general formula (2) or of a polyorganosiloxane compound represented by the general formula (3). To be specific, the following two methods can be exemplified. One method involves: mixing at least one kind of a compound among the silane compounds each represented by any one of the general formulae (22), (23), and (24) with a polyorganosilsesquioxane compound represented by the general formula (12) and/or a polyorganosiloxane compound represented by the general formula (13) in a solvent; applying the resultant solution onto a substrate; and drying the applied solution under heat. Another method involves: applying, onto a substrate, a sol obtained by hydrolyzing a solution prepared by mixing at least one kind of a compound among the compounds each represented by any one of the general formulae (22), (23), and (24) with any other silicon monomer; and drying the applied sol under heat.

The silane compounds each represented by any one of the general formulae (22), (23), and (24) can be roughly classified into a trifunctional silane monomer in which $R_{63}$, $R_{65}$, and $R_{67}$ each represent a hydroxyl group or an alkoxyl group and a bifunctional silane monomer in which $R_{63}$, $R_{65}$, and $R_{67}$ each represent neither a hydroxyl group nor an alkoxyl group. Suitable examples of the trifunctional silane monomer include, but not limited to, the following monomers

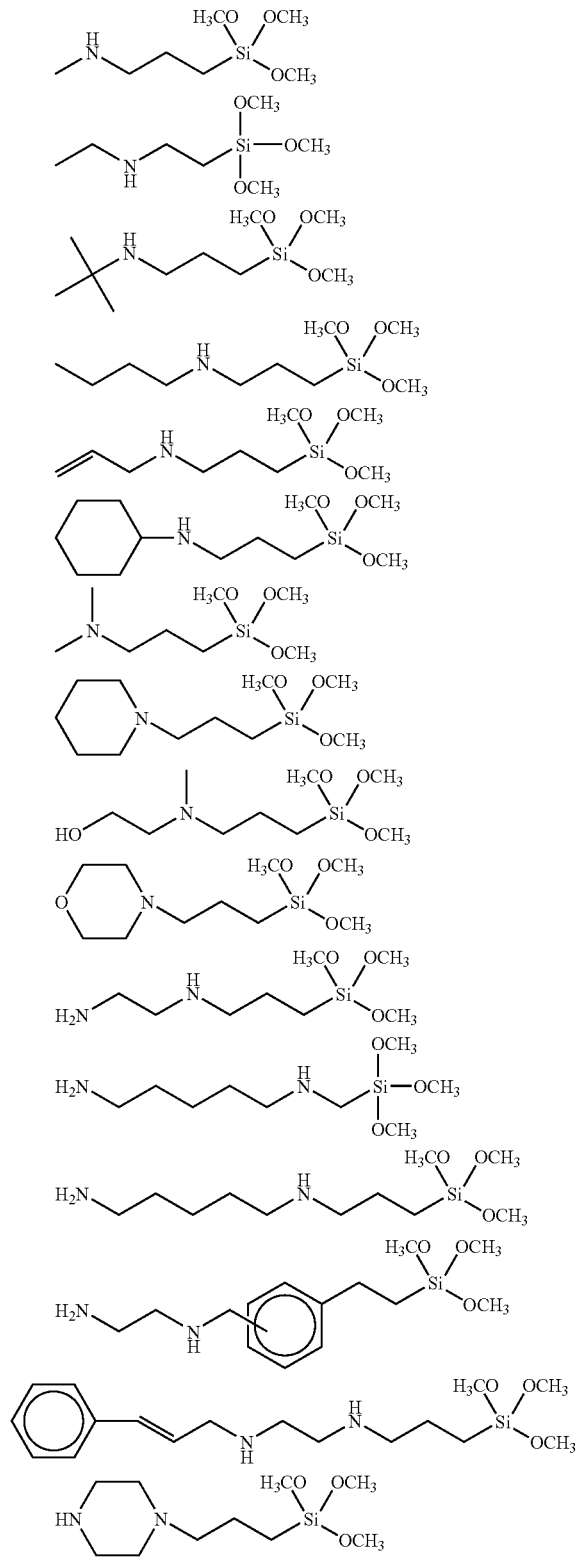

-continued

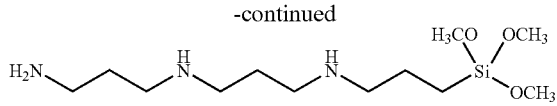

Suitable examples of the bifunctional silane monomer include, but not limited to, the following monomers.

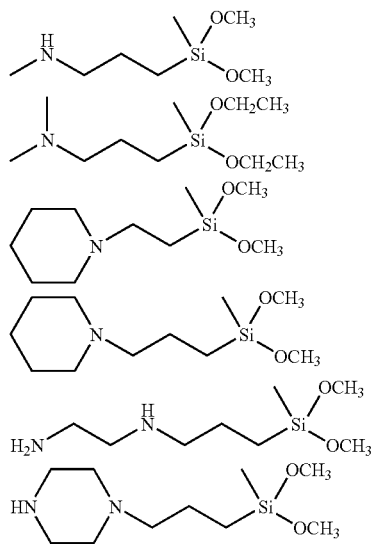

A heat treatment temperature in the case where the A layer of the present invention is formed from the polysiloxane is preferably 120° C. or higher, or more preferably 140 to 230° C. When heating is performed at lower than 120° C., a hydrolysis reaction may be insufficient.

The pure water contact angle of the surface of the A layer of the present invention is in the range of preferably 70 to 95°, or more preferably 75 to 90°. When the contact angle is less than 70°, a promoting effect on the crystal growth of the B layer is small, so sufficient transistor property may not be obtained. In addition, when the contact angle exceeds 95°, adhesiveness between the A layer and the B layer significantly reduces, so the layers peel off each other in some cases, and, in the case where the B layer is formed through the application of a solution, the solution is repelled and cannot be applied in some cases.

In the course of a crosslinking reaction or of the removal of a solvent, a stabilizer that does not evaporate, volatilize, or burn out in the temperature region in which the reaction or the removal is performed is removed from a solution system to the extent possible.

Any one of solvents such as alcohols and esters can be used as the solvent of a solution to be applied. It is desirable that a solvent be selected in consideration of, for example, wettability with respect to a substrate in order that a reaction may be promoted.

A method of applying a raw material solution of the A layer is not particularly limited. The application is performed by means of any one of the conventional coating methods such as a spin coating method, a cast method, a spray coating method, a doctor blade method, a die coating method, a dipping method, a printing method, an inkjet method, and a dropping method. Examples of the printing method include screen printing, offset printing, gravure printing, flexographic printing, and microcontact printing. Of those application methods, the spin coating method, the dipping method, the spray coating method, and the inkjet method are preferable because an application amount can be controlled so that a film having a desired thickness is formed. In addition, it is important that no dust and the like are mixed into an application solution to the extent possible to retain insulation properties in the obtained film, so it is desirable that a raw material solution be filtrated with a membrane filter in advance.

The thickness of the A layer is preferably 1 nm or more to 100 nm or less. It is more preferable that a liquid concentration be adjusted in such a manner that the thickness is 3 to 50 nm. When the thickness is less than 1 nm, a uniform film is hardly obtained, so a mobility may reduce. On the other hand, when the thickness exceeds 100 nm, an apparent dielectric substance thickness increases, so an additionally high driving voltage may be needed.

Before the A layer is applied, the surface of the substrate may be modified by means of, for example, an ultrasonic treatment with an alkali solution or irradiation with UV for improving the wettability of the surface of the substrate.

Next, a preferred embodiment of the B layer of the present invention will be described. A component of the B layer may be a low-molecular weight compound or a polymer compound as long as the component is a compound showing organic semiconductor property.

From the viewpoint of the fact that the B layer having high crystallinity can be obtained as a result of coupling with the crystallization promoting effect of the A layer, the component of the B layer is more preferably a low-molecular weight organic semiconductor having a molecular weight of 2,000 or less.

Examples of the low-molecular weight compound include an acene-based compound, a thiophene oligomer derivative, a phenylene derivative, a phthalocyanine compound, a porphyrin compound, and a cyanine dye. Examples of the polymer compound include a polyacetylene derivative, a polythiophene derivative, and a polyphenylenevinylene derivative. The B layer preferably contains an acene-based compound or a porphyrin compound in order that a transistor having a particularly high mobility may be obtained.

Examples of the acene-based compound are shown below, but the compound of the present invention is not limited to these examples.

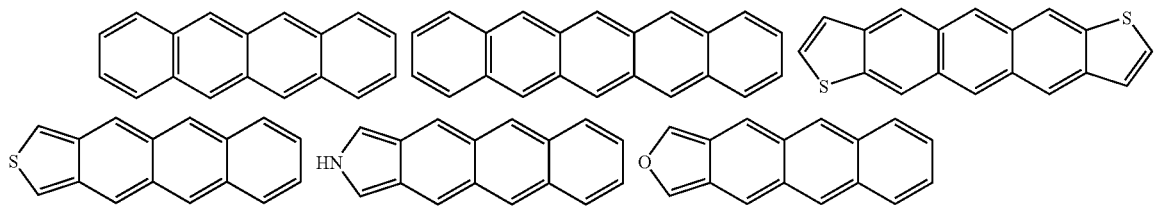

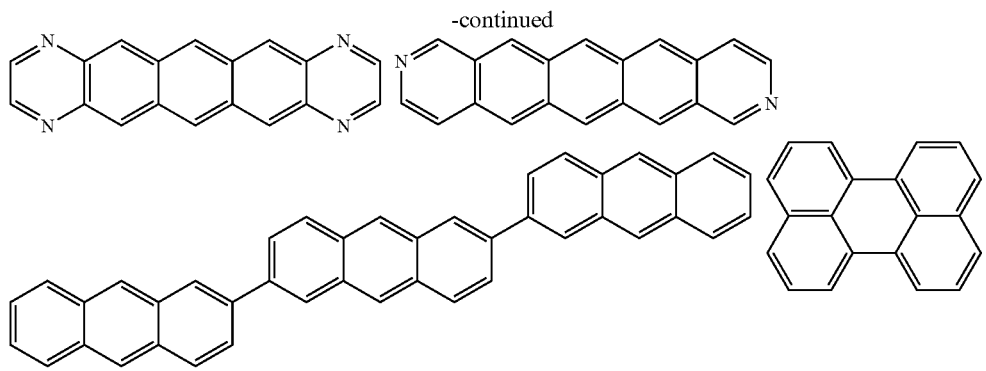

A porphyrin compound is preferably a porphyrin compound represented by the following general formula (25):

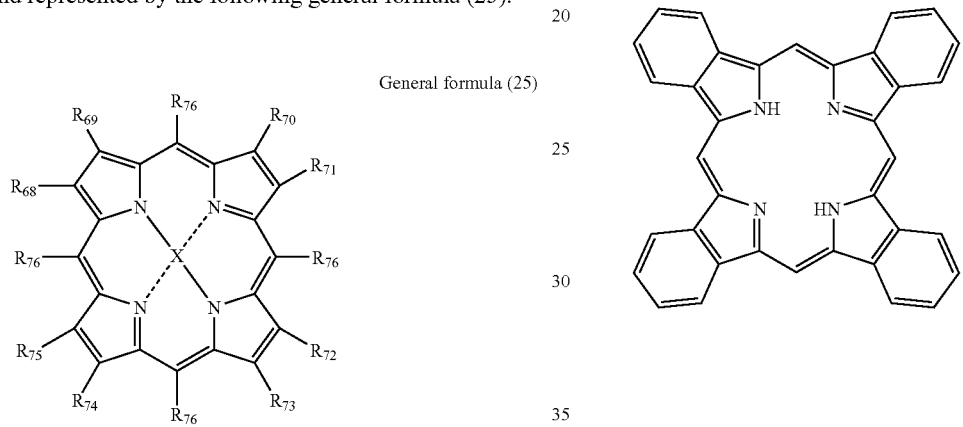

General formula (25)

where $R_{68}$ to $R_{75}$ each independently represent at least one kind selected from a hydrogen atom, a halogen atom, a hydroxyl group, and an alkyl group, oxyalkyl group, thioalkyl group, or alkylester group having 1 or more to 12 or less carbon atoms; $R_{68}$ to $R_{75}$ may be identical to or different from each other; $R_{68}$ and $R_{69}$, $R_{70}$ and $R_{71}$, $R_{72}$ and $R_{73}$, or $R_{74}$ and $R_{75}$ may bind to each other to form an aromatic ring; examples of an aromatic ring to be formed include a benzene ring, a naphthalene ring, and an anthracene ring; any formed aromatic ring may have a substituent, or may be coupled with any other porphyrin ring; $R_{76}$ may represent a hydrogen atom, or may represent a group such as an alkyl group, an alkoxyl group, or a halogen atom; X represents a hydrogen atom or a metal atom; examples of X include various metals such as H, Cu, Zn, Ni, Co, Mg, and Fe, and atomic groups such as AlCl, TiO, FeCl, and $SiCl_2$; X, which is not particularly limited, particularly preferably represents two hydrogen atoms or a copper atom; when X represents two hydrogen atoms, a non-metal porphyrin compound is obtained; and an example of the compound is a compound represented by the following general formula (29).

Examples of a porphyrin compound are shown below. Unsubstituted, non-metal structures are mainly shown, but a substituent, a central metal, and a central atomic group are not limited. Of course, the compound of the present invention is not limited to these examples.

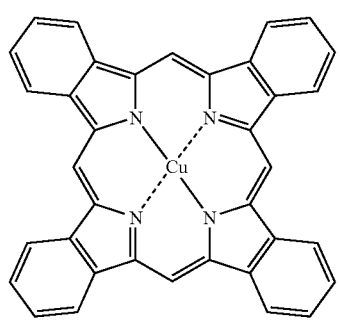

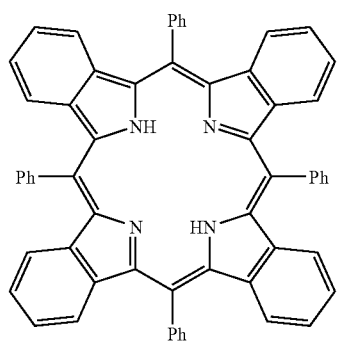

-continued
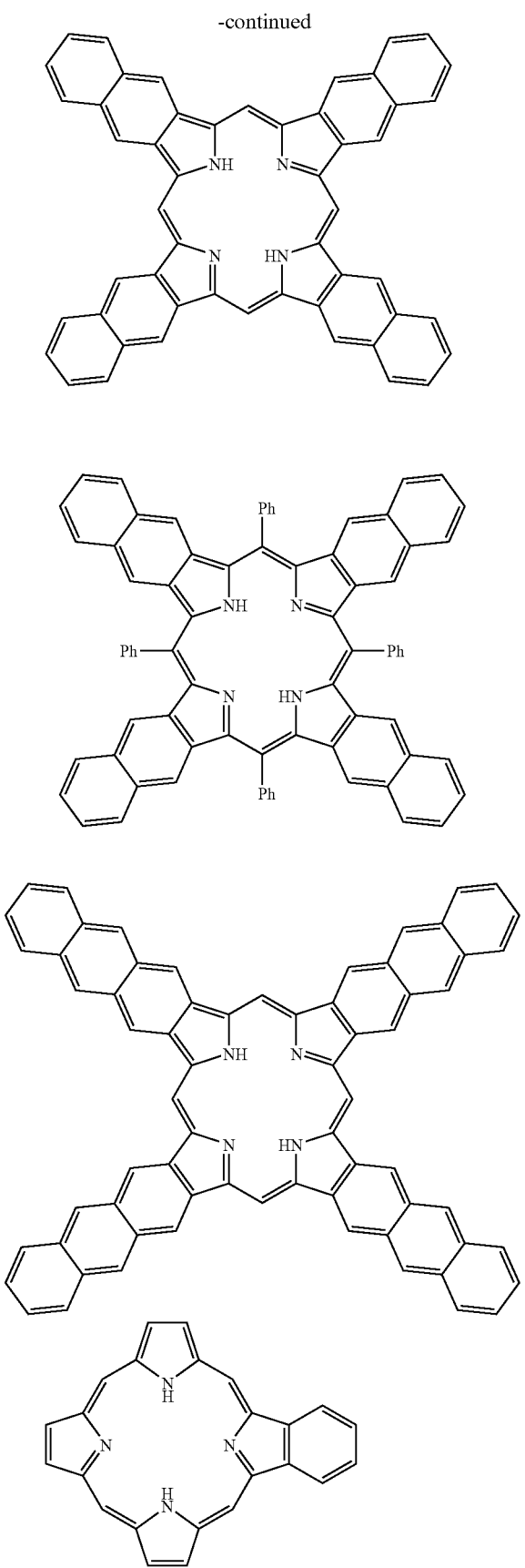
-continued
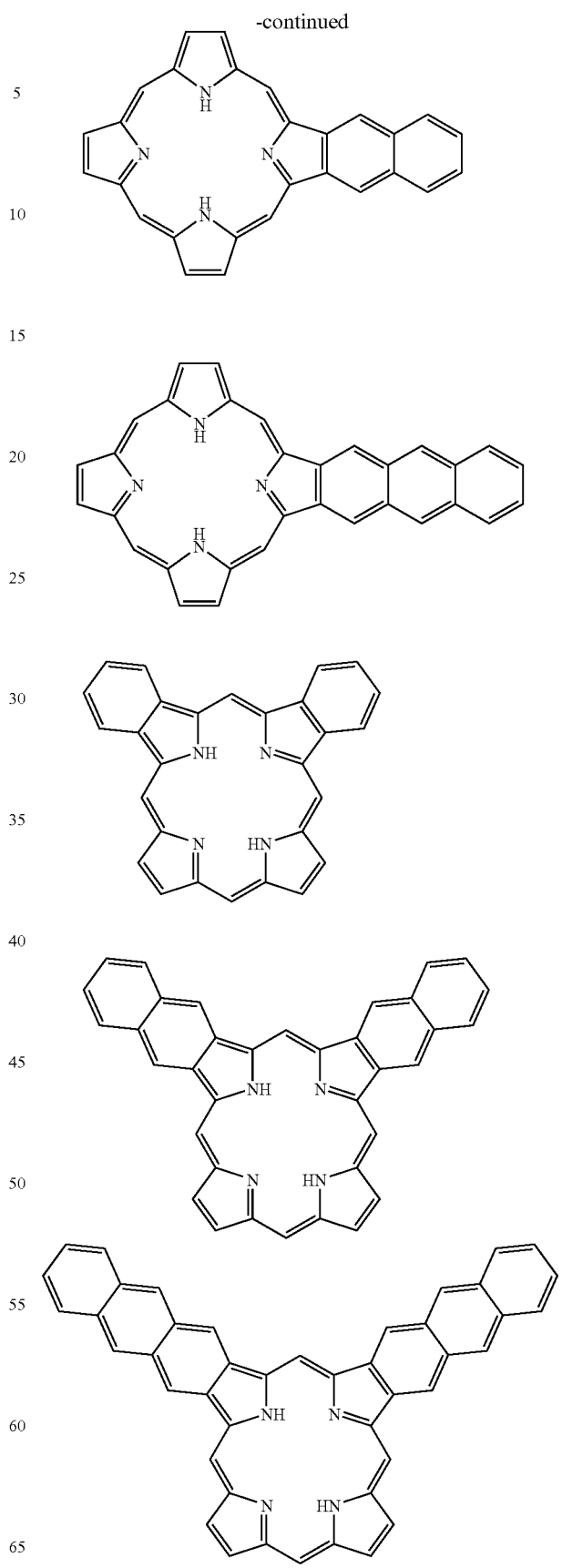

-continued
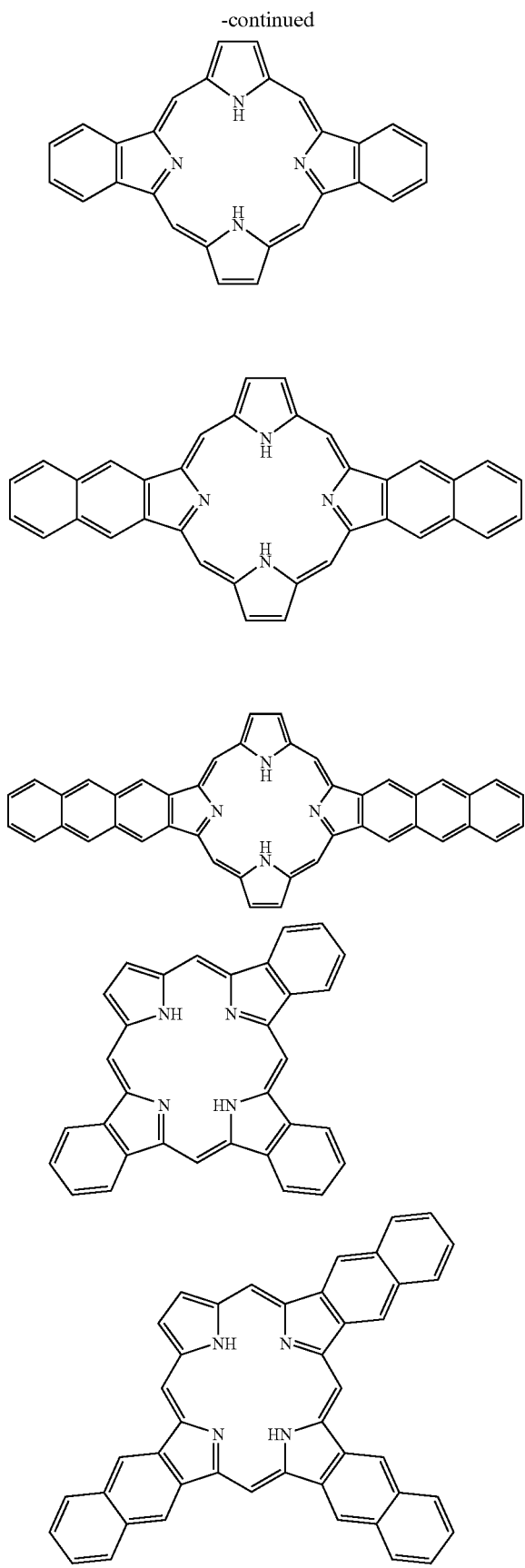
-continued
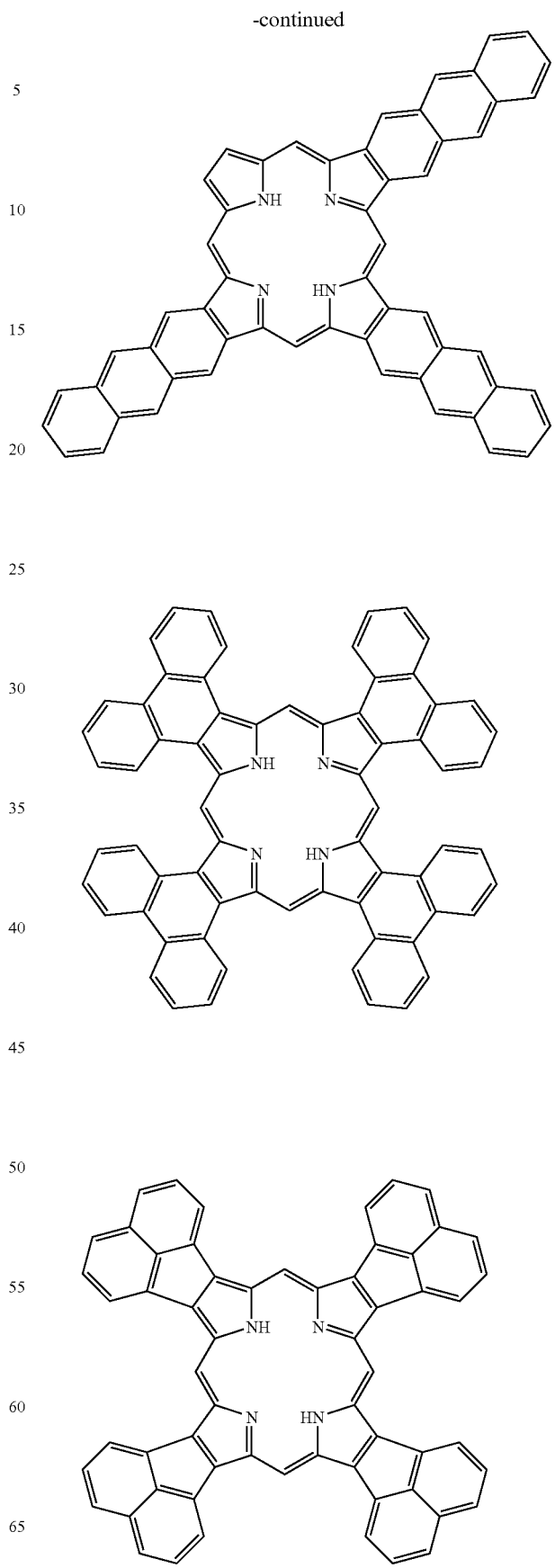

-continued

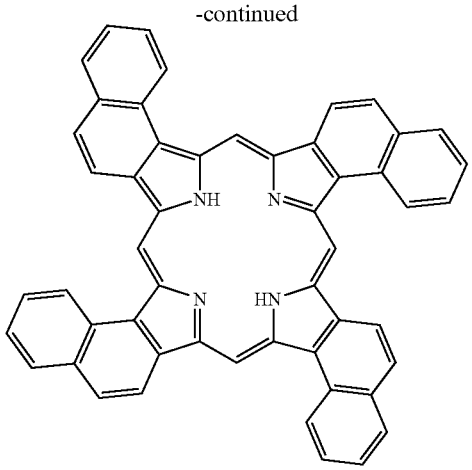

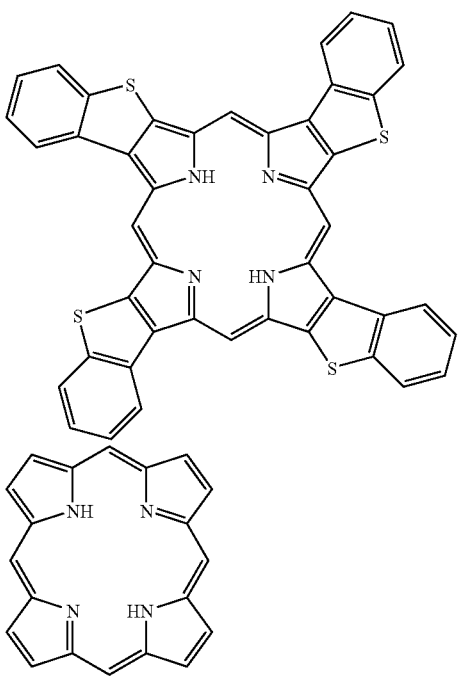

Each of those acene-based compounds and porphyrin compounds can be formed into a film by means of a general approach such as a vacuum vapor deposition method, a dispersion application method, or a solution application method on the substrate on which the A layer has been formed. Of those, the solution application method is preferable.

The B layer is preferably formed by the solution application method via a solvent-soluble precursor. An application method is not particularly limited. Application can be performed by a conventional coating method such as a spin coating method, a cast method, a spray application method, a doctor blade method, a die coating method, a dipping method, a printing method, an ink jet method, or a dropping method. Examples of the printing method include screen printing, offset printing, gravure printing, flexographic printing, and microcontact printing. Of those application methods, the spin coating method, the dipping method, the spray application method, and the ink jet method are preferable because the amount of a solution to be applied can be controlled and a film having a desired thickness can be formed. In general, an organic semiconductor crystal layer is formed by: dissolving a precursor in a solvent; forming a coating film by the application of the solution; and subjecting the resultant to, for example, heating. The precursor, which is a compound having a bulky substituent, is preferably transformed into an organic semiconductor compound having high planarity in association with the elimination of a bulky substituent part. With the method, compatibility between the application of a solution and the formation of the B layer having high crystallinity can be achieved. In addition, in view of, for example, the fact that an elimination reaction is completed and an elimination component vaporizes and hardly remains, a retro Diels-Alder reaction is preferably used because the reaction facilitates the use of an application process.

The term "Diels-Alder reaction" as used herein refers to an organic chemical reaction in which a double bond referred to as a dienophile is added to a conjugated diene to produce a cyclic structure. The retro Diels-Alder reaction is the reverse reaction of the Diels-Alder reaction, and is a reaction in which a cyclic structure formed by the Diels-Alder reaction is transformed into a conjugated diene and a dienophile.

For causing the retro Diels-Alder reaction, energy is suitably applied by means of, for example, heating, ultraviolet light, visible light, infrared light, an X ray, an electron beam, or irradiation with laser. Two or more of those energy application methods can be combined. That is, those application methods can be combined and used simultaneously or sequentially.

A bicyclo skeleton is generally used as a substituent for use in a precursor that can be subjected to the retro Diels-Alder reaction. Examples of the bicyclo skeleton are shown in reaction formulae (26) to (28):

Reaction formula (26)

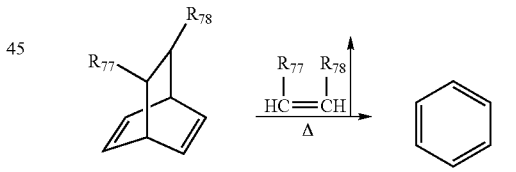

where $R_{77}$ and $R_{78}$ each independently represent a hydrogen atom, a halogen atom, a hydroxyl group, an alkyl group, an alkoxyl group, or the like; and $R_{77}$ and $R_{78}$ may bind to each other to form a ring structure.

Reaction Formula (27)

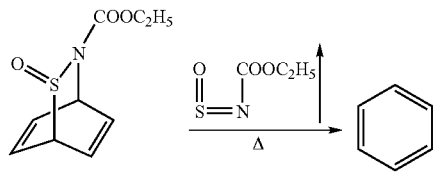

Reaction Formula (28)

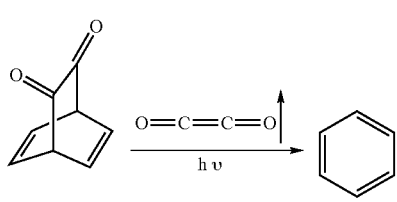

The retro Diels-Alder reaction shown in each of the reaction formula (26) and the reaction formula (27) is mainly caused by heat, and the reaction shown in the reaction formula (28) is mainly caused by irradiation with light.

Examples of an organic semiconductor precursor having a bicyclo skeleton shown in any one of the reaction formulae (26) to (28) (hereinafter referred to as "bicyclo body") are shown below.

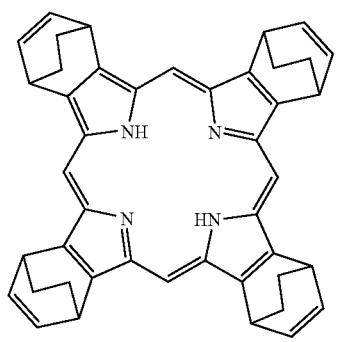

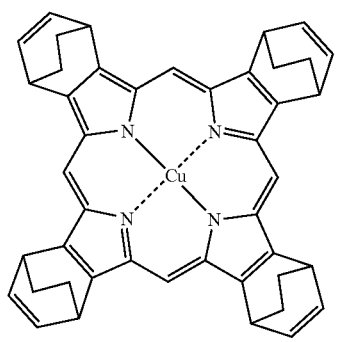

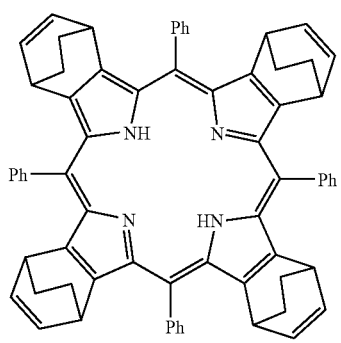

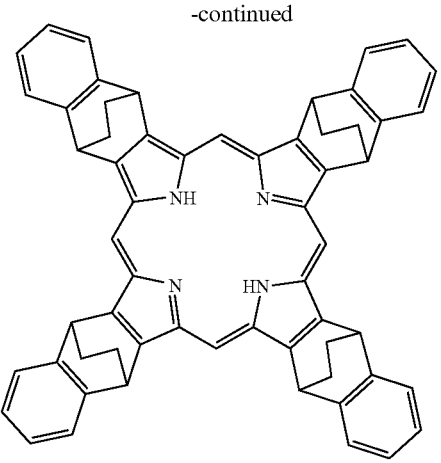

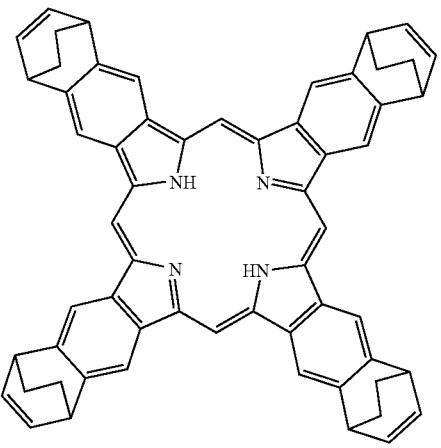

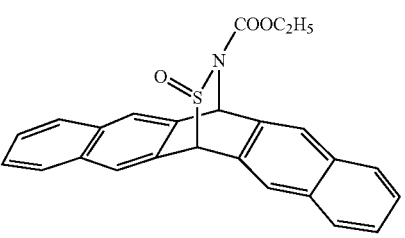

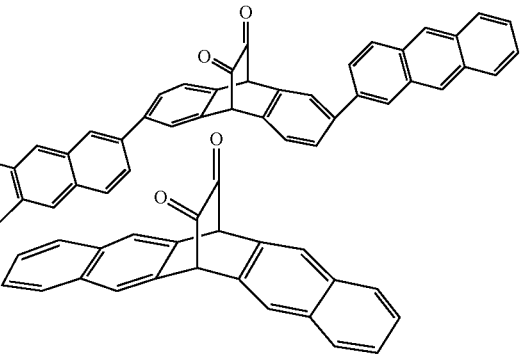

-continued

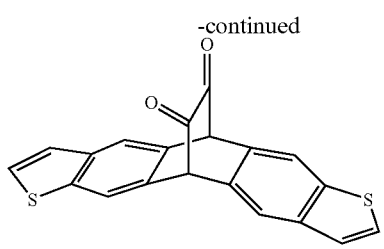

A preferable method of producing the B layer when a bicyclo body is used as a precursor involves: dissolving the bicyclo body in an organic solvent; applying the solution to the base material on which the A layer has been formed; and subjecting the resultant to heating and/or irradiation with light to produce a crystallized film of an organic semiconductor compound.

It is sufficient that the A layer and the B layer be brought into close contact with each other at least partially. Any other device component such as an electrode may be partially present between the A layer and the B layer.

The surface of the A layer may be modified by means of a general approach as required before the B layer is applied.

In addition, a precursor solution is desirably filtered by using a filter such as a membrane filter in advance in order that dust or the like may be prevented from being mixed in a semiconductor layer to the extent possible. This is because the mixing of insoluble matter or dust from the outside inhibits uniform orientation and causes an increase in off-state current or a reduction in ON/OFF ratio in some cases. In addition, upon application of a bicyclo body, predrying can be performed at a temperature of, for example, 130° C. or lower.

A bicyclo skeleton formed by application causes a retro Diels-Alder reaction owing to heating and/or irradiation with light, and is transformed into an aromatic ring (benzo body) in association with the elimination of an elimination component as shown in each of the reaction formulae (26) to (28). Crystal growth due to stacking of organic semiconductor molecules occurs simultaneously with the production of the aromatic ring, whereby a crystallized film of an organic semiconductor compound is obtained. When an elimination reaction is performed only by heating, heating at 140° C. or higher is needed in most cases. A heating temperature for obtaining an additionally high field effect mobility is in the range of preferably 150 to 280° C., or more preferably 170 to 230° C. When the temperature is lower than 150° C., a crystallized film in which crystal growth is sufficient cannot be obtained in some cases. When the temperature exceeds 280° C., cracking may occur owing to abrupt film contraction.

Heating is generally performed, for example, on a hot plate or in an oven with internal air circulation or a vacuum oven, but a heating method is not limited. A method involving performing heating on a hot plate instantaneously is preferable for obtaining uniform orientation. In addition, heating by using an infrared lamp or the like is also permitted.

On the other hand, when an elimination reaction occurs owing to irradiation with light like the reaction shown in the reaction formula (28), light having a wavelength of 300 to 500 nm is preferably applied. When light having a wavelength of less than 300 nm is applied, a side reaction except a desired elimination reaction may occur. When light having a wavelength of 500 nm or more is applied, a reduction in transistor property may occur owing to a side reaction such as the oxidation of a produced organic semiconductor.

A high-pressure mercury lamp, a low-pressure mercury lamp, a metal halide lamp, a xenon lamp, xenon flash light, an XeCl excimer lamp, or the like can be used as a light source upon irradiation with light. Any one of various optical filters and heat cut-off filters can be used in a state where the filter is sandwiched between the light source and the B layer of the present invention in order that only a wavelength needed for irradiation may be used, radiation intensity may be adjusted, or heat from the light source may be cut off.

In addition, crystallization can be promoted by performing heating simultaneously with or after irradiation with light. A heating temperature for obtaining an additionally high field effect mobility is in the range of preferably 50 to 180° C., or particularly preferably 80 to 150° C.

In addition, a rubbing treatment in which a coating film before heating is lightly rubbed with a cloth or the like can be performed in order that additionally high crystallinity may be obtained. Examples of the cloth to be used in the rubbing treatment include, but not limited to, rayon, cotton, and silk.

The thickness of the B layer to be obtained through those operations is preferably 10 to 200 nm, or more preferably 20 to 150 nm. The thickness can be measured by using, for example, a surface roughness meter or a level difference meter.

The replacement of the B layer with any other general organic semiconductor compound such as phthalocyanine is also possible.

In addition, an organic film obtained in the present invention, which is most preferably used in a filed effect transistor, is applicable to any other device or the like.

Figure 1B:
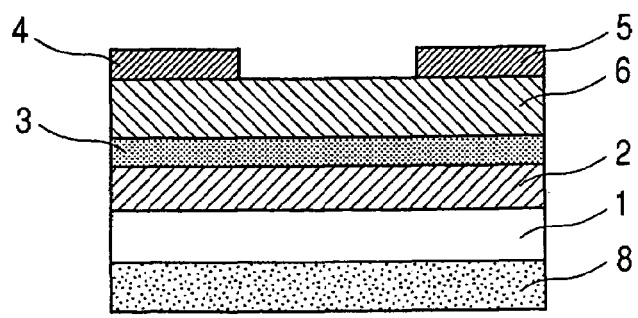
Figure 1C:
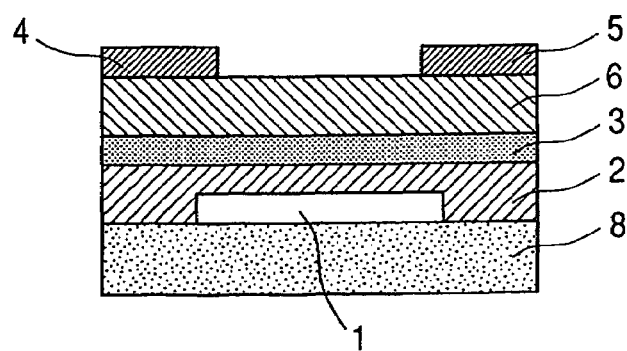

FIGS. 1B and 1C are an enlarged schematic sectional view showing part of the field effect transistor of another example of the present invention. The field effect transistor of the present invention shown in FIGS. 1B and 1C is composed of a substrate 8, a gate electrode 1, a gate insulating layer 2, a layer 3 (A layer) containing a polymer compound, a source electrode 4, a drain electrode 5, and an organic semiconductor layer 6 (B layer).

The gate electrode, the source electrode, and the drain electrode are not particularly limited as long as they are made of conductive materials. Examples of the materials include: platinum, gold, silver, nickel, chromium, copper, iron, tin, antimonial lead, tantalum, indium, aluminum, zinc, magnesium, and alloys of those metals; conductive metal oxides such as an indium-tin oxide; and inorganic and organic semiconductors with increased conductivities through doping and the like such as a silicon single crystal, polysilicon, amorphous silicon, germanium, graphite, polyacetylene, polyparaphenylene, polythiophene, polypyrrole, polyaniline, polythienylenevinylene, and polyparaphenylenevinylene. Examples of a method of producing an electrode include a sputtering method, a vapor deposition method, a printing method from a solution or a paste, an inkjet method, and a dipping method. In addition, an electrode material is preferably one of the above materials that has small electrical resistance at a contact surface with the semiconductor layer.

The insulating layer is not limited as long as the A layer can be uniformly applied to the layer; the insulating layer is preferably one having a high dielectric constant and a low conductivity. Examples of a material for the insulating layer include: inorganic oxides and nitrides such as silicon oxide, silicon nitride, aluminum oxide, titanium oxide, and tantalum oxide; and organic insulating materials such as polyacrylate, polymethacrylate, polyethylene terephthalate, polyimide, polyether, polyamide, polyamideimide, polybenzoxazole, polybenzothiazole, a phenol resin, polyvinylphenol, and an epoxy resin. An organic insulating material is preferable because a flexible, lightweight substrate can be produced. In addition, an insulating layer the surface of which has high smoothness must be formed in order that the A layer may be uniformly applied to the insulating layer. In that case, a thermosetting resin using a phenol resin, polyvinylphenol, or an epoxy resin is preferable because the surface of the insulating layer can be smoothened irrespective of a ground for the insulating layer (such as a gate electrode) and the resin is unaffected by a solvent upon formation of the A layer.

Examples of the substrate 8 to be suitably used in the present invention include substrates made of silicon, glass, a metal, a resin, and the like which have been processed into a plate shape, a foil shape, a film shape, or a sheet shape. A resin substrate is particularly preferable from the perspective of flexibility and processability. Examples of materials of the resin substrate to be used include polyethylene terephthalate (PET), polyethylene naphthalate (PEN), polyimide (PI), polyetherimide (PEI), polyether sulfone (PES), polysulfone (PSF), polyphenylene sulfide (PPS), polyether ether ketone (PEEK), polyarylate (PAR), polyamide imide (PAI), a polycycloolefin resin, an acrylic resin, polystyrene, ABS, polyethylene, polypropylene, a polyamide resin, a polycarbonate resin, a polyphenylene ether resin, and a cellulose resin. An organic-inorganic composite material obtained by mixing an inorganic oxide particle with or bonding an inorganic material to any one of those resin materials may be used. When the gate electrode functions a substrate in FIG. 1B, a filed effect transistor can be formed without using a substrate.

A field effect transistor structure in the present invention may be of any one of a top contact electrode type, a bottom contact electrode type, and a top gate electrode type. In addition, the structure is not limited to a horizontal type structure, and may be a vertical type structure (structure in which one of a source electrode and a drain electrode is present on the surface of an organic semiconductor layer on the side of a base material and the other is present on the surface of the organic semiconductor layer on the side opposite to the base material).

EXAMPLE

Hereinafter, Synthesis Examples and Examples are shown. However, the present invention is not limited to these examples.

Synthesis Example 1

Step 1-1

A mixed solution of 3.16 g (39.5 mmol) of 1,3-cyclohexadiene, 10.5 g (34.1 mmol) of trans-1,2-bis(phenylsulfonyl) ethylene, and 200 ml of toluene was refluxed for 7 hours. After that, the solution was cooled and concentrated under reduced pressure to yield a reaction mixture. The crude reaction product was recrystallized (chloroform/hexane) to yield 5,6-bis(phenylsulfonyl)-bicyclo[2.2.2]octa-2-ene (13.8 g, 35.6 mmol, 90% yield).

Step 1-2

The reaction system of a mixed solution of 7.76 g (20 mmol) of the resultant 5,6-bis(phenylsulfonyl)-bicyclo [2.2.2]octa-2-ene and 50 ml of anhydrous tetrahydrofuran was replaced with nitrogen. Then, 2.425 ml (22 mmol) of ethyl isocyanoacetate were added to the solution, and the mixture was cooled to 0° C. Potassium t-butoxide (50 ml/1 M tetrahydrofuran (THF) solution) was dropped over 2 hours, and the whole was stirred at room temperature for 3 hours. After the completion of the reaction, dilute hydrochloric acid was added, and then the reaction mixture was washed with a saturated aqueous solution of sodium hydrogen carbonate, distilled water, and a saturated salt solution in this order, followed by drying with anhydrous sodium sulfate. The dried product was purified by silica gel column chromatography (chloroform) to yield ethyl-4,7-dihydro-4,7-ethano-2H-isoindole-1-carboxylate (3.5 g, 16 mmol, 80% yield).

Step 1-3

Under an argon atmosphere, a mixed solution of 0.42 g (1.92 mmol) of the resultant ethyl-4,7-dihydro-4,7-ethano-2H-isoindole-1-carboxylate and 50 ml of anhydrous THF was cooled to 0° C. Then, 0.228 g (6 mmol) of lithium aluminum hydride powder was added to the solution, and the whole was stirred for 2 hours. After that, THF was removed from the resultant, the remainder was subjected to extraction with chloroform, and the extract was washed with a saturated aqueous solution of sodium hydrogen carbonate, distilled water, and a saturated salt solution in this order, followed by drying with anhydrous sodium sulfate. The reaction solution was filtered, replaced with argon, and shielded from light. Then, 10 mg of p-toluenesulfonic acid were added to the resultant, and the whole was stirred at room temperature for 12 hours. Further, 0.11 g of p-chloranil was added to the mixture, and the whole was stirred at room temperature for 12 hours. Then, the mixture was washed with a saturated aqueous solution of sodium hydrogen carbonate, distilled water, and a saturated salt solution in this order, followed by drying with anhydrous sodium sulfate. After the concentration of the solution, alumina column chromatography (chloroform) and recrystallization (chloroform/methanol) were performed to yield a metal-free tetrabicyclo body represented by the following general formula (29) (0.060 g, 0.097 mmol, 20% yield).

General formula (29)

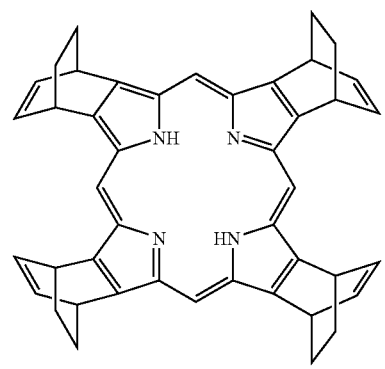

Step 1-4

A solution of 0.02 g (0.032 mmol) of the resultant metal-free tetrabicyclo body and 0.019 g (0.1 mmol) of cupric acetate monohydrate in a mixture of 30 ml of chloroform and 3 ml of methanol was stirred at room temperature for 3 hours. The reaction solution was washed with distilled water and a saturated salt solution, and was dried with anhydrous sodium sulfate. After the concentration of the solution, the concentrated product was recrystallized with chloroform/methanol to yield a tetrabicyclo copper complex represented by the following general formula (30) (0.022 g, 100% yield).

General formula (30)

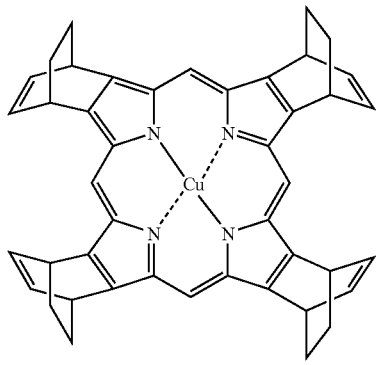

Synthesis Example 2

Step 2-1

Pentacene (1.39 g, 5.0 mmol), vinylene carbonate (0.32 g, 5.0 mmol), and xylene (95 ml) were loaded into an autoclave, and the whole was stirred at 180° C. for 72 hours. After the reaction, the resultant was concentrated under reduced pressure and dried, whereby a compound represented by the following general formula (31) was obtained (1.78 g, 98%).

General formula (31)

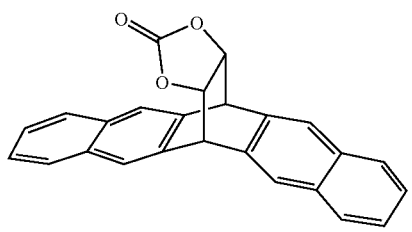

Step 2-2

The compound obtained in Step 2-1 (1 g, 2.7 mmol) was loaded into a reaction vessel, and was dissolved in 1,4-dioxane (30 ml). (4 ml) NaOH (11.3 ml) was added to the solution, and the whole was refluxed for 1 hour. After the completion of the reaction, the reactant was poured into water, and the whole was extracted with ethyl acetate. An organic layer was washed with water and a saturated salt solution, dried with anhydrous sodium sulfate, and concentrated under reduced pressure. As a result, 6,13-dihydro-15,16-dihydroxy-6,13-ethanopentacene represented by the following general formula (32) was obtained (0.91 g, 100%).

General formula (32)

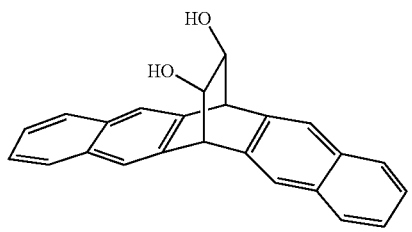

Step 2-3

A reaction vessel was replaced with nitrogen, and dimethyl sulfoxide (8.6 ml, 93.5 mmol) and methylene chloride (48 ml) were added. After the temperature of the reaction vessel had been cooled to −60° C., trifluoroacetic anhydride (11.7 ml, 84.3 mmol) was added, and the whole was stirred for 10 minutes. After the stirring, a solution prepared by dissolving 6,13-dihydro-15,16-dihydroxy-6,13-ethanopentacene obtained in Step 2-2 (0.96 g, 2.7 mmol) in dimethyl sulfoxide (4 ml) was slowly dropped to the reaction solution. After the dropping, the resultant was stirred for 1.5 hours while the temperature of the reaction vessel was kept at −60° C., and then triethylamine (27.5 ml) was added. After that, the resultant was stirred for an additional 1.5 hours, and then the temperature of the reaction vessel was returned to room temperature. The reaction solution was poured into 150 ml of 10% hydrochloric acid, and the whole was extracted with methylene chloride. An organic layer was washed with water and a saturated salt solution, dried with anhydrous sodium sulfate, and concentrated under reduced pressure. The resultant coarse product was washed with ethyl acetate, whereby 6,13-dihydro-6,13-ethanopentacene-15,16-dione represented by the following general formula (33) was obtained (0.45 g, 50%).

General formula (33)

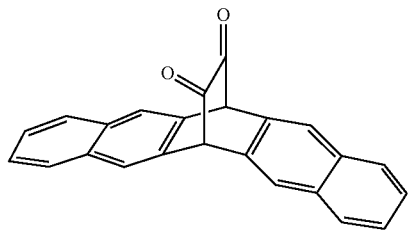

Synthesis Example 3

Next, description will be made by taking 2,6-dianthryl-9,10-dihydro-9,10-ethanoanthracene-11,12-dione as an example.

Step 3-1

2,6-dibromoanthracene (2.41 mmol, 0.67 g), vinylene carbonate (3.80 mmol, 0.21 ml), and xylene anhydride (10 ml) were loaded into an autoclave, and the whole was subjected to a reaction at 180° C. for 3 days. After that, the temperature was returned to room temperature, and the resultant was concentrated under reduced pressure. The resultant coarse product was purified by means of silica gel column chromatography. As a result, 2,6-dibromo-9,10-dihydro-9,10-ethanoanthracene-cis-11,12-diyl carbonate represented by the following general formula (34) was obtained (0.73 g, 72%).

General formula (34)

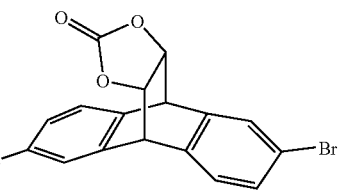

Step 3-2

2,6-dibromo-9,10-dihydro-9,10-ethanoanthracene-cis-11,12-diyl carbonate (0.58 mmol, 0.24 g) obtained in Step 3-1, boronic ester (1.33 mmol, 0.40 g) obtained by a method as described in the document (K. Ito, T. Suzuki, Y. Sakamoto, D. Kubota, Y. Inoue, F. Sato, S. Tokito, Angew. Chem. Int. Ed. 2003, 42, 1159-1162), tetrakis(triphenylphosphine)palladium (0) (0.066 mmol, 0.077 g), toluene (202 ml), and 1N Na$_2$CO$_3$ (8.5 ml) were loaded into a flask, and the whole was replaced with nitrogen and then the resultant was refluxed for 18 hours. After that, the temperature of the resultant was returned to room temperature, and the resultant was filtrated through Celite. The filtrated product was washed with toluene. After that, the filtrate was concentrated under reduced pressure, and the resultant coarse product was purified by silica gel chromatography, whereby 2,6-(2'-anthryl)-9,10-dihydro-9,10-ethanoanthracene-cis-11,12-diyl carbonate represented by the following general formula (35) was obtained (0.089 g, 25%).

49.5 g of ethanol and 49.5 g of 1-butanol. 0.25 g of methyltrimethoxysilane, 0.05 g of an alkoxysilane having an amino group, and 0.05 g of distilled water were added to the solution, and the whole was stirred at room temperature for 48 hours. The resultant solution was passed through a membrane filter made of PTFE and having a pore size of 0.2 μm, whereby each of polymer solutions a to e was prepared. Table 1 shows the alkoxysilane having an amino group in each polymer solution and the addition amount of the alkoxusilane.

Preparation of Polymer Solution f 0.7 g of commercially available, flaky methylsilsesquioxane (MSQ) (manufactured by SHOWA DENKO K.K., trade name GR650) was dissolved in a mixed solvent composed of 49.5 g of ethanol and 49.5 g of 1-butanol. 0.3 g of N-(2-aminoethyl)-3-aminopropyltrimethoxysilane and 0.3 g of distilled water were added to the solution, and the whole was stirred at room temperature for 48 hours. The resultant solu- General formula (35)

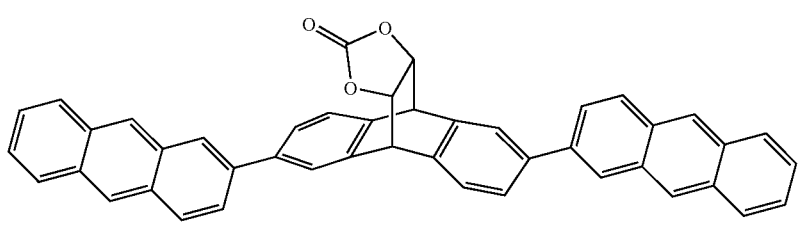

Step 3-3

2,6-(2'-anthryl)-9,10-dihydro-9,10-ethanoanthracene-cis-11,12-diyl carbonate obtained in Step 3-2 (0.11 mmol, 0.067 g) was loaded into a mixed solution of 4N NaOH (2 ml) and 1,4-dioxane (4 ml), and the whole was replaced with nitrogen. After that, the resultant was refluxed for 1 hour, and the temperature of the resultant was returned to room temperature. Water was added to the resultant, and the whole was extracted with chloroform. An organic layer was washed with water and a saturated salt solution, dried with anhydrous sodium sulfate, and concentrated under reduced pressure, whereby a diol body was obtained. The resultant diol body was subjected to Swern oxidation in the same manner as in Synthesis Example 1 (Step 1-3). As a result, 2,6-dianthryl-9,10-dihydro-9,10-ethanoanthracene-11,12-dione represented by the following general formula (36) was obtained (0.046 g, 69%).

tion was passed through a membrane filter made of PTFE and having a pore size of 0.2 μm, whereby a polymer solution f was prepared.

Preparation of Polymer Solution g 0.7 g of commercially available, flaky methylsilsesquioxane (MSQ) (manufactured by SHOWA DENKO K.K., trade name GR650) was dissolved in a mixed solvent composed of 49.5 g of ethanol and 49.5 g of 1-butanol. 0.25 g of methyltrimethoxysilane, 0.05 g of 3-aminopropyltriethoxysilane, and 0.05 g of distilled water were added to the solution, and the whole was stirred at room temperature for 48 hours. The resultant solution was passed through a membrane filter made of PTFE and having a pore size of 0.2 μm, whereby a polymer solution g was prepared.

Preparation of Polymer Solution h

Oily polydimethylsiloxane (manufactured by Dow Corning Toray Co., Ltd., trade name Dow Corning 200) was com- General formula (36)

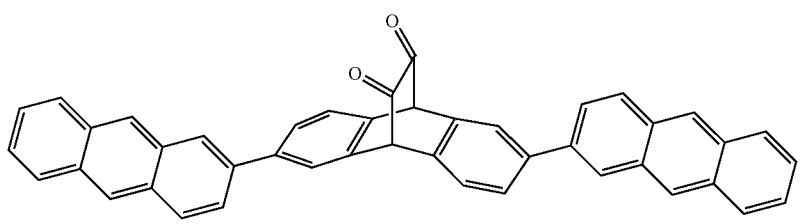

Preparation of Polymer Solutions a to e 0.7 g of commercially available, flaky methylsilsesquioxane (MSQ) (manufactured by SHOWA DENKO K.K., trade name GR650) was dissolved in a mixed solvent composed of pletely dissolved in 99 g of toluene, and the resultant solution was passed through a membrane filter made of PTFE and having a pore size of 0.2 μm, whereby a polymer solution h was prepared.

Preparation of Silica Sol i 0.95 g of methyltrimethoxysilane, 0.05 g of N-(2-aminoethyl)-3-aminopropyltrimethoxysilane, and 0.05 g of distilled water were added to a mixed solvent composed of 49.5 g of ethanol and 49.5 g of 1-butanol. After that, the resultant was stirred at room temperature for 48 hours, whereby a silica sol i was prepared.

Preparation of Silane Solution j 1 g of 3-aminopropyltriethoxysilane was added to 99 g of ethanol in such a manner that a uniform solution would be obtained. The resultant solution was passed through a membrane filter made of PTFE and having a pore size of 0.2 μm, whereby a silane solution j was prepared.

with internal air circulation at 180° C. for 60 minutes, whereby the insulating layer 2 having a thickness of 500 nm was formed. The entire surface was coated with a fluorine resin, and the pure water contact angle of the surface was set to 115° or more. After that, ultraviolet light was applied in a source-drain electrode pattern, and the pure water contact angle of the area to which ultraviolet light had been applied was reduced to 50° or less. After that, the above-mentioned silver particle paste (manufactured by NIPPON PAINT Co., Ltd., Fine Sphere SVE102) was supplied to the source-drain electrode pattern, and the whole was heated in an oven with internal air circulation at 180° C. for 30 minutes, whereby a source-drain silver electrode was formed. Further, the entire surface was irradiated with ultraviolet light in such a manner that the fluorine coating would be removed, whereby a resin substrate 1 for evaluation on which the source-drain silver electrode having a channel length L of 50 μm and a channel width W of 3 mm had been formed was produced.

Formation of Layer Containing Polymer Compound (B Layer)

Any one of the polymer solutions a to f and the silica sol i was applied to the surface of the resin substrate for evaluation by a spin coating method (at a number of revolutions of 5,000 rpm). Next, the coating film thus obtained was cured by heating in an oven with internal air circulation at 180° C. for 30 minutes. The thickness of the film measured with a stylus level difference meter was about 10 nm. The water contact angle of the surface of the substrate was measured with a fully automatic contact angle meter (manufactured by Kyowa Interface Science Co., LTD., trade name DCA-WZ). In addi-

TABLE 1

| | Amino group-containing alkoxysilane | Addition amount (wt %) |
|---|---|---|
| Polymer solution a | H₂N–CH₂CH₂–NH–(CH₂)₃–Si(OCH₃)₃ | 5 |
| Polymer solution b | CH₃CH₂CH₂–NH–(CH₂)₃–Si(OCH₃)₃ | 5 |
| Polymer solution c | (CH₃CH₂CH₂)₂N–(CH₂)₃–Si(OCH₃)₃ | 5 |
| Polymer solution d | H₂N–CH₂CH₂–NH–CH₂–C₆H₄–CH₂CH₂–Si(OCH₃)₃ | 5 |
| Polymer solution e | H₂N–CH₂CH₂–NH–(CH₂)₃–Si(OCH₃)₂(CH₃) | 5 |
| Polymer solution f | H₂N–CH₂CH₂–NH–(CH₂)₃–Si(OCH₃)₃ | 30 |
| Polymer solution g | H₂N–(CH₂)₃–Si(OCH₃)₃ | 5 |
| Silica sol i | H₂N–CH₂CH₂–NH–(CH₂)₃–Si(OCH₃)₃ | 5 |
| Silane solution j | H₂N–(CH₂)₃–Si(OCH₃)₃ | 100 |

Examples 1 to 11

(Production of Resin Substrate)

An upper part of a PET substrate having a thickness of 188 μm the surface of which had been provided with a phenol resin planarization layer having a thickness of 3 μm was coated with a silver nanoparticle paste (manufactured by NIPPON PAINT Co., Ltd., Fine Sphere. SVE102). After that, the resultant was heated in an oven with internal air circulation at 180° C. for 30 minutes, whereby a gate electrode having a thickness of 130 nm was formed. An upper part of the resultant was additionally coated with a thermosetting resin composition of poly(p-vinylphenol) (weight average molecular weight 12,000)/melamine crosslinking agent (manufactured by SANWA CHEMICAL CO., LTD., trade name Nikalac MX-750LM)/1-butanol/ethanol=7/3/63/27 (weight ratio). After that, the resultant was heated in an oven tion, solvent resistance is obtained when silanols or unreacted alkoxides in a polymer solution are condensed by a dehydration or dealcoholization reaction to provide a polymer having a silsesquioxane skeleton or an organosiloxane skeleton. Therefore, judgement as to whether a polymer was sufficiently cured to provide a compound having a siloxane skeleton or a compound having a silsesquioxane skeleton was made on the basis of solvent resistance against chloroform. Table 2 shows the pure water contact angle of the surface of the substrate and the result of the visual evaluation for solvent resistance.

Formation of Organic Semiconductor Layer (A Layer)

Formation of Organic Semiconductor Layer A-1

A 1-wt % solution of the non-metal tetrabicyclo body (general formula (29)) synthesized in Synthesis Example 1 in chloroform was applied to the substrate by a spin coating method, whereby a coating film was formed (at a number of revolutions of 1,000 rpm). After an unnecessary film except one on a channel had been removed by using non-woven fabric impregnated with chloroform, the substrate was heated at 200° C. for 5 minutes, whereby an organic semiconductor layer A-1 composed of a benzo body represented by the following general formula (37) was formed. The thickness of the organic semiconductor layer A-1 was about 80 nm.

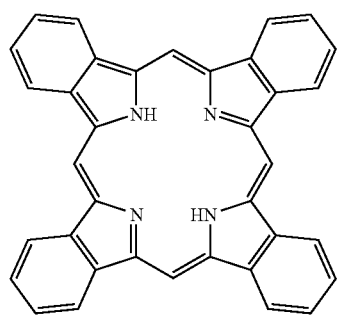

General formula (37)

Formation of Organic Semiconductor Layer A-2

A 1-wt % solution of the tetrabicyclo copper complex (general formula (30)) synthesized in Synthesis Example 1 in chloroform was applied to the substrate by a spin coating method, whereby a coating film was formed (at a number of revolutions of 1,000 rpm). After an unnecessary film except one on a channel had been removed by using non-woven fabric impregnated with chloroform, the substrate was heated at 200° C. for 15 minutes, whereby an organic semiconductor layer A-2 composed of a benzo body represented by the following general formula (38) was formed. The thickness of the organic semiconductor layer A-2 was about 80 nm.

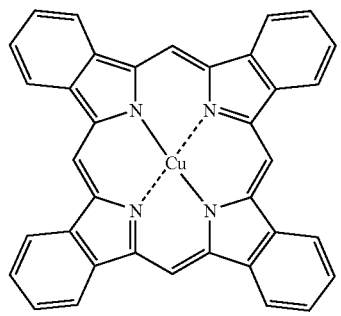

General formula (38)

Formation of Organic Semiconductor Layer A-3

A 1.5-wt % solution of 6,13-dihydro-6,13-ethanopentacene-15,16-dione (general formula (33)) synthesized in Synthesis Example 2 in chloroform was applied by a spin coating method, whereby a coating film was formed (at a number of revolutions of 1,000 rpm). An unnecessary film except one on a channel was removed by using non-woven fabric impregnated with chloroform. After that, the substrate was mounted on a hot plate set at 130° C., and was irradiated with light of a metal halide lamp (PCS-UMX 250) manufactured by NIPPON P.I. CO., LTD. the wavelength of which had been cut off with a heat absorbing filter and a blue filter for 5 minutes. As a result, an organic semiconductor layer A-3 composed of pentacene was formed. The thickness of the organic semiconductor layer A-3 was about 100 nm.

Formation of Organic Semiconductor Layer A-4

A 1.5-wt % solution of 2,6-dianthryl-9,10-dihydro-9,10-ethanoanthracene-11,12-dione (general formula (36)) synthesized in Synthesis Example 3 in chloroform was applied by a spin coating method. The number of revolutions was set to 1,000 rpm. As a result, a coating film was formed. An unnecessary film except one on a channel was removed by using non-woven fabric impregnated with chloroform. After that, the substrate was mounted on a hot plate set at 130° C., and was irradiated with light of a metal halide lamp (PCS-UMX 250) manufactured by NIPPON P.I. CO., LTD. the wavelength of which had been cut off with a heat absorbing filter and a blue filter for 5 minutes. As a result, an organic semiconductor layer A-4 composed of a compound represented by the following general formula (39) was formed. The thickness of the organic semiconductor layer A-4 was about 100 nm.

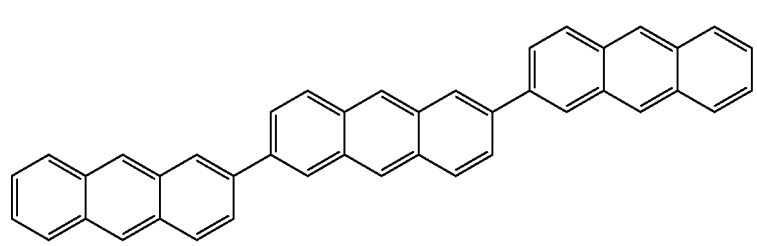

General formula (39)

Evaluation of Transistor Characteristic

The $V_d$-$I_d$ and $V_g$-$I_d$ curves of the produced transistor were measured by using a Parameter Analyzer 4156C (trade name) manufactured by Agilent.

The mobility μ (cm$^2$/Vs) was calculated in accordance with the following equation (1).

$$I_d = \mu(CiW/2L) \times (V_g - V_{th})^2 \qquad \text{(Eq. 1)}$$

In the equation, Ci represents the capacitance per unit area of the gate insulating film (F/cm$^2$), W and L represent a channel width (mm) and a channel length (μm) shown in the example, respectively, and $I_d$, $V_g$, and $V_{th}$ represent a drain current (A), a gate voltage (V), and a threshold voltage (V), respectively. In addition, a ratio between $I_d$'s at $V_g$=−40 V and 0 V at $V_d$=−40 V was provided as an ON/OFF ratio. Table 2 shows the results.

Comparative Examples 1 and 2

The polymer solution g was applied to the surface of the resin substrate for evaluation by a spin coating method (at a number of revolutions of 5,000 rpm). Next, the coating film was cured by heating in an oven with internal air circulation at 180° C. for 30 minutes. The thickness of the film measured with a stylus level difference meter was about 10 nm. Evaluation for: the water contact angle of the surface of the substrate; and solvent resistance against chloroform was visually performed in the same manner as in any one of the examples.

Further, an organic semiconductor layer was formed in the same manner as in the organic semiconductor layer B or the organic semiconductor layer C, and was evaluated for transistor property in the same manner as that described above. Table 2 shows the results.

Comparative Example 3

The polymer solution h was applied to the surface of the resin substrate for evaluation by a spin coating method, (at a number of revolutions of 5,000 rpm). Next, the coating film was cured by heating in an oven with internal air circulation at 180° C. for 30 minutes. The surface of the coating film was observed with an optical microscope. As a result, it was observed that polymers were nonuniformly dispersed and hence the coating film was whitish. Solvent resistance against chloroform was confirmed. As a result, the coating film was dissolved at room temperature, so an organic semiconductor layer could not be formed.

Comparative Examples 4 and 5

A silane compound was applied by a dip coating method involving: immersing the glass substrate 1 for evaluation or a resin substrate 2 for evaluation in the silane solution j; and slowly lifting the substrate. Next, the coating film was baked in an oven with internal air circulation at 180° C. for 30 minutes. The thickness of the film could not be accurately measured with a stylus level difference meter because the thickness was 5 nm or less. Evaluation for: the water contact angle of the surface of the substrate; and solvent resistance against chloroform was performed in the same manner as in any one of the examples.

Further, an organic semiconductor layer was formed in the same manner as in the organic semiconductor layer B or the organic semiconductor layer C, and was evaluated for transistor property in the same manner as that described above. Table 2 shows the results.

TABLE 2

| | | Organic semiconductor layer | Solvent resistance of crystallization promoting layer | Pure water contact angle (°) | Mobility cm$^2$/Vs | On/Off |
|---|---|---|---|---|---|---|
| Example 1 | Polymer solution a | A | Good | 86 | 0.20 | 13,000 |
| Example 2 | Polymer solution a | B | Good | — | 1.21 | 3,200 |
| Example 3 | Polymer solution a | C | Good | — | 0.19 | 3.5 × 10$^5$ |
| Example 4 | Polymer solution a | D | Good | — | 0.022 | 4.2 × 10$^4$ |
| Example 5 | Polymer solution b | B | Good | 86 | 0.93 | 2,900 |
| Example 6 | Polymer solution c | B | Good | 85 | 0.88 | 3,500 |
| Example 7 | Polymer solution d | B | Good | 86 | 1.01 | 1,600 |
| Example 8 | Polymer solution d | C | Good | — | 0.11 | 1.1 × 10$^5$ |
| Example 9 | Polymer solution e | B | Good | 84 | 0.75 | 2,000 |
| Example 10 | Polymer solution f | B | Good | 79 | 0.79 | 1,200 |
| Example 11 | Silica soli | B | Good | 82 | 0.65 | 1,400 |
| Comparative example 1 | Polymer solution g | B | Good | 85 | 0.31 | 25 |
| Comparative example 2 | Polymer solution g | C | Good | — | 0.035 | 8,500 |
| Comparative example 3 | Polymer solution h | B | Bad | 101 | Unmeasurable | Unmeasurable |
| Comparative example 4 | Silane solution j | B | — | 70 | 8.1 × 10$^{-3}$ | 10 |
| Comparative example 5 | Silane solution j | C | — | — | 2.3 × 10$^{-3}$ | 1,200 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-258567, filed Sep. 6, 2005, which is hereby incorporated by reference herein in its entirety.

What is claimed is:

1. A semiconductor device comprising:
a substrate;
a layer containing one or more kinds of polymer compounds on the substrate; and
an organic semiconductor layer in contact with the layer containing the one or more kinds of polymer compounds,
wherein at least one kind of the one or more kinds of polymer compounds comprises a polymer compound having one or more secondary or tertiary aliphatic amino groups,
wherein the one or more aliphatic amino groups is present in at least one of a side chain and a branched chain of the polymer compound having the one or more aliphatic amino groups,
wherein the layer containing the one or more kinds of polymer compounds contains polysiloxane compounds, and
wherein at least one kind of the polysiloxane compounds comprises a compound having a siloxane structure represented by any one of the following general formula (4), the following general formula (5), and the following general formula (6):

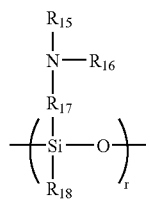

General formula (4)

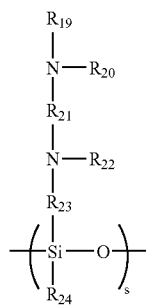

General formula (5)

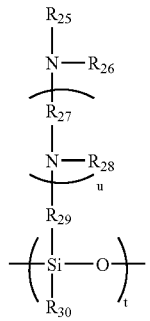

General formula (6)

where $R_{15}$, $R_{16}$, $R_{19}$, $R_{20}$, $R_{22}$, $R_{25}$, $R_{26}$, and $R_{28}$ each independently represent a hydrogen atom, a substituted or unsubstituted alkyl group, alkenyl group, or alkynyl group having 1 to 12 carbon atoms, a benzyl group, a phenethyl group, or a styryl group; any one combination of $R_{15}$ and $R_{16}$, $R_{19}$ and $R_{20}$, $R_{19}$ and $R_{22}$, and $R_{25}$ and $R_{26}$ may bind to each other to form a ring structure; one of $R_{15}$ and $R_{16}$ represents a substituent except a hydrogen atom; $R_{17}$, $R_{21}$, $R_{23}$, $R_{27}$, and $R_{29}$ each represent a divalent organic group which has 1 to 12 carbon atoms and which is not directly bound to an aromatic ring; $R_{18}$, $R_{24}$, and $R_{30}$ each represent a hydroxyl group, a substituted or unsubstituted alkyl group, alkenyl group, alkynyl group, or alkoxyl group having 1 to 12 carbon atoms, a benzyl group, a phenethyl group, a styryl group, or a siloxane unit; r, s, and t each represent an integer of 1 or more; and u represents an integer of 2 or more.

2. The semiconductor device according to claim 1, wherein the organic semiconductor layer comprises a low-molecular weight organic semiconductor.

3. The semiconductor device according to claim 1, wherein the organic semiconductor layer comprises one of an acene-based compound or a porphyrin compound.

4. The semiconductor device according to claim 1, wherein a first surface of the layer containing the one or more kinds of polymer compounds is in contact with the organic semiconductor layer, and a second surface of the layer containing the one or more kinds of polymer compounds is in contact with an organic resin layer, said first and second surfaces being opposite to one another.

5. The semiconductor device according to claim 1, wherein the layer containing the one or more kinds of polymer compounds is a crystallization promoting layer.

6. The semiconductor device according to claim 5, wherein the crystallization promoting layer has a function of promoting bonding between crystal grains.

* * * * *